(12) United States Patent
Koyama

(10) Patent No.: US 10,237,505 B2
(45) Date of Patent: Mar. 19, 2019

(54) SOLID-STATE IMAGING DEVICE USING REPEATER CIRCUITS TO HOLD PHASE INFORMATION

(71) Applicant: OLYMPUS CORPORATION, Hachioji-shi, Tokyo (JP)

(72) Inventor: Yusaku Koyama, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 8 days.

(21) Appl. No.: 15/671,327

(22) Filed: Aug. 8, 2017

(65) Prior Publication Data
US 2017/0339362 A1 Nov. 23, 2017

Related U.S. Application Data

(63) Continuation of application No. PCT/JP2015/059357, filed on Mar. 26, 2015.

(51) Int. Cl.
*H04N 5/3745* (2011.01)
*H04N 5/335* (2011.01)
(Continued)

(52) U.S. Cl.
CPC ..... *H04N 5/3745* (2013.01); *H01L 27/14609* (2013.01); *H04N 3/155* (2013.01);
(Continued)

(58) Field of Classification Search
CPC .. H04N 5/3745; H04N 5/3355; H04N 5/3765; H04N 5/3658; H04N 3/155;
(Continued)

(56) References Cited

U.S. PATENT DOCUMENTS

| 7,952,630 B2 * | 5/2011 | Taura | H04N 5/378 348/294 |
| 8,941,045 B2 * | 1/2015 | Okura | H03M 1/00 250/208.1 |

(Continued)

FOREIGN PATENT DOCUMENTS

| JP | 2011-166197 A | 8/2011 |
| JP | 2012-257169 A | 12/2012 |

(Continued)

OTHER PUBLICATIONS

International Search Report dated Jun. 16, 2015, issued in counterpart application No. PCT/JP2015/059357, w/English translation. (2 pages).

*Primary Examiner* — Lin Ye
*Assistant Examiner* — Chan T Nguyen
(74) *Attorney, Agent, or Firm* — Westerman, Hattori, Daniels & Adrian

(57) ABSTRACT

A solid-state imaging device including: a pixel array unit in which a plurality of pixels outputting an analog pixel signal are arranged in a two-dimensional matrix form; a ramp signal generation unit configured to generate and output a ramp wave; a clock generation unit configured to generate and output multiphase clocks; and a signal-processing unit, wherein the signal-processing unit including: a plurality of analog-to-digital conversion circuits, and a plurality of repeater circuits, wherein each of the plurality of analog-to-digital conversion circuits includes: a comparison unit, and a latch unit, wherein each of the plurality of the analog-to-digital conversion circuits outputs the digital value according to the state of the phase held by each latch circuit, and wherein each of the plurality of the repeater circuits corresponding to the same set are arranged side by side, and the repeater circuits are connected in series.

13 Claims, 5 Drawing Sheets

(51) Int. Cl.
*H04N 3/14* (2006.01)
*H04N 5/374* (2011.01)
*H04N 5/378* (2011.01)
*H01L 27/146* (2006.01)
*H04N 5/345* (2011.01)
*H04N 5/347* (2011.01)
*H04N 5/365* (2011.01)
*H04N 5/369* (2011.01)
*H04N 5/376* (2011.01)
*H03M 1/12* (2006.01)
*H03M 1/56* (2006.01)

(52) U.S. Cl.
CPC ........... *H04N 5/3355* (2013.01); *H04N 5/347* (2013.01); *H04N 5/3456* (2013.01); *H04N 5/3658* (2013.01); *H04N 5/3698* (2013.01); *H04N 5/374* (2013.01); *H04N 5/378* (2013.01); *H04N 5/3765* (2013.01); *H03M 1/123* (2013.01); *H03M 1/56* (2013.01)

(58) Field of Classification Search
CPC .... H04N 5/3698; H04N 5/347; H04N 5/3456; H04N 5/378; H04N 5/374; H01L 27/14609; H03M 1/123; H03M 1/56
USPC ........................................................ 348/308
See application file for complete search history.

(56) References Cited

U.S. PATENT DOCUMENTS

| | | | |
|---|---|---|---|
| 8,994,575 B2* | 3/2015 | Hagihara | G04F 10/005 |
| | | | 341/155 |
| 9,338,384 B2* | 5/2016 | Kusano | H04N 5/378 |
| 9,918,032 B2* | 3/2018 | Hagihara | H04N 5/378 |
| 2014/0084140 A1* | 3/2014 | Kusano | H03K 3/86 |
| | | | 250/208.1 |
| 2014/0191112 A1* | 7/2014 | Kusano | H04N 5/378 |
| | | | 250/208.1 |

FOREIGN PATENT DOCUMENTS

| | | |
|---|---|---|
| JP | 2013-26675 A | 2/2013 |
| JP | 5372667 B2 | 12/2013 |
| JP | 2014-135553 A | 7/2014 |

* cited by examiner

SOLID-STATE IMAGING DEVICE USING REPEATER CIRCUITS TO HOLD PHASE INFORMATION

This application is a continuation application based on a PCT International Application No. PCT/JP2015/059357, filed on Mar. 26, 2015. The content of the PCT International Application is incorporated herein by reference.

BACKGROUND OF THE INVENTION

Field of the Invention

The present invention relates to a solid-state imaging device.

Description of Related Art

In recent years, CMOS (complementary metal oxide semiconductor) solid-state imaging devices have attracted attention as a solid-state imaging device and been put to practical use. As a solid-state imaging device that is mounted on a digital camera, a digital video camera, an endoscope, or the like, a solid-state imaging device including an analog-to-digital converter (hereinafter referred to as an A/D conversion circuit), that is, a so-called column ADC type solid-state imaging device, has been developed and commercialized.

A single-slope (SS) type A/D conversion scheme is generally widely known as one A/D conversion scheme in an A/D conversion circuit included in such a solid-state imaging device. In the SS type A/D conversion scheme, a period from a time at which a comparison between an analog reference voltage called a ramp wave of which a voltage monotonically decreases or increases at a constant rate with respect to time and a signal voltage that is an analog-to-digital conversion (A/D conversion) target is started, that is, from a timing at which the A/D conversion is started, to a time at which the reference voltage and the signal voltage become the same voltage, is counted using a reference clock at a predetermined frequency. In the SS type A/D conversion scheme, a value obtained by counting (a count value) is output as a digital value obtained by performing A/D conversion on a signal voltage. In the A/D conversion circuit of an SS type A/D conversion scheme, resolution of the A/D conversion depends on a frequency of a reference clock for counting a period in which the reference voltage and the signal voltage are compared.

In recent years, an A/D conversion circuit of an SS+time conversion (TDC: Time to Digital Converter) type A/D conversion scheme for improving the resolution of the A/D conversion by causing a reference clock of an SS type A/D conversion scheme to have phase information has been proposed. In the A/D conversion circuit of the SS+TDC type A/D conversion scheme, a value (a count value) obtained by counting a period in which a reference voltage and a signal voltage are compared using a reference clock is set as an upper bit of a digital value to be output, and phase information held (latched) in a latch circuit when the reference voltage and the signal voltage become the same voltage is set as a lower bit of the digital value to be output to achieve improvement of the resolution of the A/D conversion.

For example, Japanese Patent No. 5372667 discloses a technology of a solid-state imaging device for achieving improvement of resolution of A/D conversion, that is, resolution of a digital value of each pixel output by the solid-state imaging device, by providing an A/D conversion circuit of an SS+TDC type A/D conversion scheme built in each column of a pixel array unit.

However, when the number of columns of pixels in the pixel array unit is increased due to an increase in the number of pixels included in the solid-state imaging device, a length of a signal wiring for transferring a plurality of respective clocks caused to hold phase information (hereinafter referred to as "multiphase clocks") to respective A/D conversion circuits corresponding to each column is increased. If the length of the signal wiring transferring the multiphase clock increases, a transfer delay of the multiphase clock, a timing error between a rising edge and a falling edge of the multiphase clock, or the like occurs according to the length of the signal wiring for each multiphase clock. Accordingly, the same phase information cannot be input to all of the A/D conversion circuits corresponding to each column of the pixel array unit, and the resolution of the A/D conversion is degraded.

In a solid-state imaging device in which the A/D conversion circuit of an SS+TDC type A/D conversion scheme is built in each column of the pixel array unit, it is important to accurately transfer the phase information to the A/D conversion circuits of all the columns, that is, to input a multiphase clock having no transfer delay, timing error between a rising edge and a falling edge, or the like to the latch circuit in the A/D conversion circuits of all the columns to improve resolution of a digital value of each pixel to be output.

For example, Japanese Unexamined Patent Application, First Publication No. 2012-257169 discloses a technology of a solid-state imaging device in which, when a driving signal is input to each signal-processing circuit corresponding to each column of a pixel array unit, a buffer circuit is provided in each predetermined number of signal-processing circuits (a signal-processing circuit group), that is, every plurality of columns of a pixel array unit, to input a driving signal to each signal-processing circuit. It is conceivable that the technology disclosed in Japanese Unexamined Patent Application, First Publication No. 2012-257169 can be applied to a solid-state imaging device in which an A/D conversion circuit of an SS+TDC type A/D conversion scheme is built in each column of the pixel array unit to transfer a multiphase clock via a buffer circuit, such that respective multiphase clocks can be accurately transferred to the respective A/D conversion circuits.

For example, it is conceivable that a technology of the solid-state imaging device disclosed in Japanese Unexamined Patent Application, First Publication No. 2013-026675 could be applied to a solid state imaging device in which an A/D conversion circuit of an SS+TDC type A/D conversion scheme is built in each column of the pixel array unit. According to Japanese Unexamined Patent Application, First Publication No. 2013-026675, a technology for arranging a buffer circuit between respective latch circuits is disclosed. A technology of alternately arranging a latch circuit and a buffer circuit is disclosed in the technology disclosed in Japanese Unexamined Patent Application, First Publication No. 2013-026675. It is conceivable that the technology disclosed in Japanese Unexamined Patent Application, First Publication No. 2013-026675 could be applied to the solid-state imaging device in which the A/D conversion circuit of an SS+TDC type A/D conversion scheme is built in each column of the pixel array unit, so that respective multiphase clocks via the buffer circuit can be accurately transferred (input) to each of the latch circuits in the A/D conversion circuit.

SUMMARY OF THE INVENTION

According to a first aspect of the present invention, a solid-state imaging device includes a pixel array unit in which a plurality of pixels outputting an analog pixel signal according to the quantity of incident light are arranged in a two-dimensional matrix form, the pixel array unit outputting the pixel signal for each row, and the pixel signal being output by the pixels arranged in each column; a ramp signal generation unit configured to generate and output a ramp wave which is an analog reference voltage monotonically decreasing or monotonically increasing at a constant rate with respect to time; a clock generation unit configured to generate and output multiphase clocks obtained by changing a phase of a clock serving as a reference into a different phase; and a signal-processing unit, wherein the signal-processing unit including: a plurality of analog-to-digital conversion circuits, the plurality of analog-to-digital conversion circuits being arranged in each column or in every multiple columns of the pixels arranged in the pixel array unit, the plurality of analog-to-digital conversion circuits performing analog-to-digital conversion on the pixel signal output by the pixel of the corresponding column according to the multiphase clocks, and the plurality of analog-to-digital conversion circuits outputting a digital value according to a magnitude of the pixel signal, and a plurality of repeater circuits, the plurality of repeater circuits respectively corresponding to a plurality of sets into which the plurality of analog-to-digital conversion circuits are divided for a predetermined number in advance, and the plurality of repeater circuits respectively relaying and transferring the plurality of multiphase clocks to the plurality of analog-to-digital conversion circuits included in the corresponding set, wherein each of the plurality of analog-to-digital conversion circuits includes: a comparison unit configured to compare a voltage of the pixel signal with the ramp wave and output a timing signal according to a comparison result of the voltage of the pixel signal and the ramp wave, and a latch unit in which a plurality of latch circuits are arranged side by side in a column direction, each of the plurality of latch circuits holding a state of each phase of the multiphase clocks transferred by the corresponding repeater circuits according to the timing signal, wherein each of the plurality of the analog-to-digital conversion circuits outputs the digital value according to the state of the phase held by each latch circuit arranged in the latch unit, and wherein each of the plurality of the repeater circuits corresponding to the same set are arranged side by side in the column direction and arranged between the analog-to-digital conversion circuits included in the different sets, and the repeater circuits corresponding to the different sets that transfer the multiphase clocks indicating the same phase, are connected in series.

According to a second aspect of the present invention, in the solid-state imaging device of the first aspect, power may be supplied to each of the plurality of the repeater circuits by a corresponding sub-wiring formed to extend in the column direction from a main-wiring formed in the row direction at respective positions at which the plurality of the repeater circuits corresponding to the same set are arranged side by side in the column direction, and a width of a region for forming the main-wiring in the column direction may be greater than a width of a region for forming each sub-wiring in the row direction.

According to a third aspect of the present invention, in the solid-state imaging device of the first aspect, power may be supplied to each of the plurality of the repeater circuits by a corresponding sub-wiring formed to extend in the column direction from a main-wiring formed in the row direction at respective positions at which the plurality of the repeater circuits corresponding to the same set are arranged side by side in the column direction, and a region for forming each sub-wiring may not overlap a region of a power wiring for supplying power to each latch circuit.

According to a fourth aspect of the present invention, in the solid-state imaging device of the first aspect, power may be supplied to each of the plurality of the latch circuits by a corresponding sub-wiring formed to extend in the column direction from a main-wiring formed in the row direction at respective positions at which the plurality of the latch circuits included in the same analog-to-digital conversion circuit are arranged side by side in the column direction, and a width in the column direction of a region for forming the main-wiring may be greater than a width in the row direction of a region for forming each respective sub-wiring.

According to a fifth aspect of the present invention, in the solid-state imaging device of the first aspect, power may be supplied to each of the plurality of the latch circuits by a corresponding sub-wiring formed to extend in the column direction from a main-wiring formed in the row direction at respective positions at which the plurality of the latch circuits included in the same analog-to-digital conversion circuit are arranged side by side in the column direction, and a region for forming each sub-wiring may not overlap a region of the power wiring for supplying power to each repeater circuit.

According to a sixth aspect of the present invention, in the solid-state imaging device of the fourth aspect, the respective sub-wirings are formed by collecting the sub-wirings corresponding to the respective latch circuits included in a predetermined number of analog-to-digital conversion circuits belonging to the same set.

According to a seventh aspect of the present invention, in the solid-state imaging device of the fifth aspect, the respective sub-wirings are formed by collecting the sub-wirings corresponding to the respective latch circuits included in a predetermined number of analog-to-digital conversion circuits belonging to the same set.

According to an eighth aspect of the present invention, in the solid-state imaging device of the first aspect, the signal-processing units may be dividedly arranged to correspond to a plurality of respective groups into which the plurality of the pixels arranged in the pixel array unit are divided for each predetermined column of pixels, and the clock generation unit may be arranged at a position between the dividedly arranged signal-processing units.

According to a ninth aspect of the present invention, in the solid-state imaging device of the eighth aspect, the plurality of the arranged pixels in the pixel array unit may be divided into the two groups for each column of the pixels, the signal-processing units may be dividedly arranged in a first signal-processing unit corresponding to one of the groups and a second signal-processing unit corresponding to the other group, and the clock generation unit may be arranged at a position between the first signal-processing unit and the second signal-processing unit.

According to a tenth aspect of the present invention, in the solid-state imaging device of the eighth aspect, the plurality of the arranged pixels in the pixel array unit may be divided into two groups having a left group and a right group at a position of a center column for each column of the pixels, the signal-processing units may be dividedly arranged in a first signal-processing unit corresponding to the left group and a second signal-processing unit corresponding to the right group, and the clock generation unit may be arranged at a center position between the first signal-processing unit and the second signal-processing unit.

According to an eleventh aspect of the present invention, in the solid-state imaging device of the first aspect, the signal-processing unit may be arranged on any one side in the column direction of the pixel array unit, and a width in the row direction of a region for forming each analog-to-digital conversion circuit may be smaller than an interval between the two pixels arranged adjacent in the row direction in the pixel array unit.

According to a twelfth aspect of the present invention, in the solid-state imaging device of the first aspect, the signal-processing units may be dividedly arranged on two opposite sides in a column direction of the pixel array unit to correspond to a plurality of respective groups into which the plurality of pixels arranged in the pixel array unit are divided for each predetermined column of pixels, and a width in a row direction of a region for forming the respective analog-to-digital conversion circuits respectively included in the signal-processing units that are dividedly arranged may be greater than an interval between two pixels arranged adjacent in the row direction in the pixel any unit and may be smaller than a width in the row direction at which the two pixels arranged adjacent in the row direction are formed.

According to a thirteenth aspect of the present invention, in the solid-state imaging device of the first aspect, a first substrate on which at least the pixel array unit is formed and a second substrate on which at least the signal-processing unit is formed may be electrically connected by a connection portion that connects the first substrate to the second substrate.

DETAILED DESCRIPTION OF THE INVENTION

First Embodiment

Figure 1:
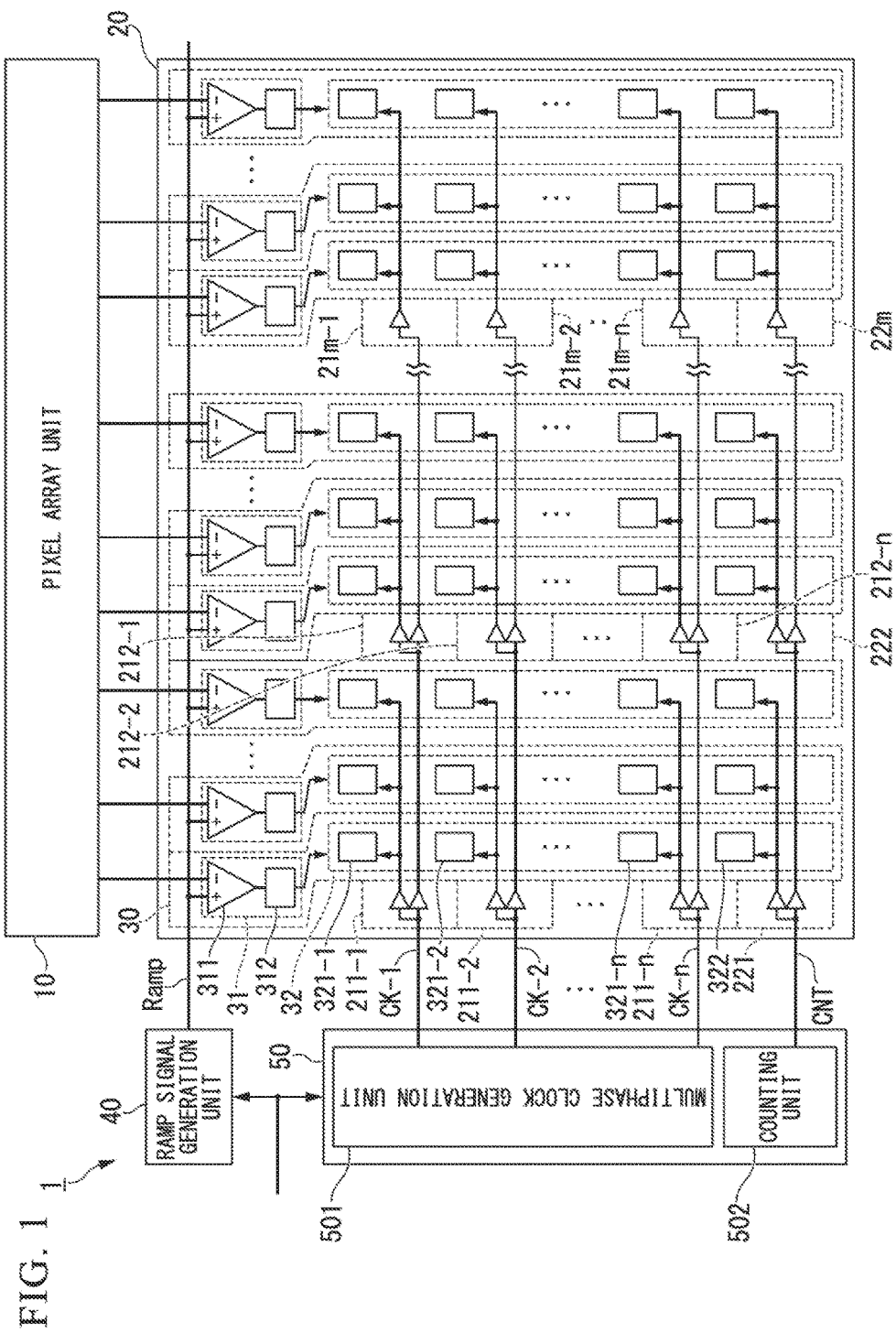
FIG. 1 is a block diagram showing an example of a schematic configuration of a solid-state imaging device according to a first embodiment of the present invention.

Embodiments of the present invention will be described with reference to the drawings. FIG. 1 is a block diagram showing an example of a schematic configuration of a solid-state imaging device of a first embodiment of the present invention. The solid-state imaging device 1 shown in FIG. 1 includes a pixel array unit 10, a column A/D conversion unit 20, a ramp signal generation unit 40, and a clock generation unit 50.

The solid-state imaging device 1 performs analog-to-digital conversion (A/D conversion) on respective pixel signals output from the respective pixels included in the pixel array unit 10 using the respective A/D conversion circuits 30 of an SS+TDC type A/D conversion scheme (hereinafter referred to as an "A/D conversion circuit 30") included in the column A/D conversion unit 20, and sequentially outputs digital values of the pixels.

The solid-state imaging device 1 includes a vertical scanning unit that drives pixels included in the pixel array unit 10 on a row-by-row basis of the pixel array unit 10, or a horizontal scanning unit that performs control for sequentially outputting digital values of the pixels A/D converted by the A/D conversion circuit 30 included in the column A/D conversion unit 20 to the outside of the solid-state imaging device 1 in units of columns of the pixel array unit 10. The solid-state imaging device 1 further includes a control unit that controls driving of components such as a column A/D conversion unit 20, a ramp signal generation unit 40, a clock generation unit 50, a vertical scanning unit, and a horizontal scanning unit. In FIG. 1, illustration of components such as the vertical scanning unit, the horizontal scanning unit, and the control unit is omitted.

The pixel array unit 10 is a pixel array unit in which a plurality of pixels (not shown) are arranged two-dimensionally in the row direction and the column direction. Each of the pixels includes a photoelectric conversion element, and the photoelectric conversion element included in each pixel generates a pixel signal according to the quantity of light incident in a certain accumulation time. The pixel array unit 10 outputs the pixel signals generated by the respective pixels to the column A/D conversion unit 20 for each row of the pixel array unit 10 according to driving in the vertical scanning unit.

The ramp signal generation unit 40 generates a ramp wave Ramp that is an analog reference voltage that monotonically decreases or increases at a constant rate with respect to time from a timing at which each A/D conversion circuit 30 included in the column A/D conversion unit 20 starts A/D conversion. The ramp signal generation unit 40 outputs the generated ramp wave Ramp to the column A/D conversion unit 20.

The clock generation unit 50 generates a reference clock at a predetermined frequency, and various signals that are used when the respective A/D conversion circuits 30 included in the column A/D conversion unit 20 perform the A/D conversion. The clock generation unit 50 includes a multiphase clock generation unit 501 and a counting unit 502.

The multiphase clock generation unit 501 changes the phase of the reference clock to a different phase, from a timing at which the ramp signal generation unit 40 outputs the ramp wave Ramp to the column A/D conversion unit 20, that is, a timing at which each A/D conversion circuit 30 starts the A/D conversion, to generate a plurality of clocks CK (hereinafter referred to as a "multiphase clock CK") obtained by causing the reference clock to have phase information. The multiphase clock generation unit 501 outputs the generated multiphase clock CK to the column A/D conversion unit 20. In the solid-state imaging device 1 shown in FIG. 1, the multiphase clock generation unit 501 outputs n (n is an integer equal to or greater than 2) types of multiphase clocks CK-1 to CK-n obtained by changing the phase of the reference clock to the column A/D conversion unit 20.

The counting unit 502 counts the reference clock from the timing at which the ramp signal generation unit 40 outputs the ramp wave Ramp to the column A/D conversion unit 20, that is, the timing at which each A/D conversion circuit 30 starts the A/D conversion. The counting unit 502 outputs a counted value (count value CNT) to the column A/D conversion unit 20.

The column A/D conversion unit 20 is a signal-processing unit including a plurality of A/D conversion circuits 30 having the same configuration, corresponding to the number of columns of the pixels arranged in the pixel array unit 10. In general, one A/D conversion circuit 30 includes the ramp signal generation unit 40 and the clock generation unit 50, whereas in the solid-state imaging device 1 shown in FIG. 1, one ramp signal generation unit 40 and one clock generation unit 50 are included in common for all the A/D conversion circuits 30 included in the column A/D conversion unit 20.

The A/D conversion circuit 30 corresponding to each column of the pixel array unit 10 performs A/D conversion on a pixel signal (analog signal) generated by the pixel in the corresponding column, which is input from the pixel array unit 10. More specifically, each A/D conversion circuit 30 performs A/D conversion on the pixel signal input from the pixel array unit 10 according to the ramp wave Ramp, the multiphase clock CK, and the count value CNT that have been input. The respective A/D conversion circuits 30 sequentially output a digital value (a digital value of the pixel) according to a magnitude of the pixel signal subjected to the A/D conversion to the outside of the solid-state imaging device 1 for each column of the pixel array unit 10 under control from the horizontal scanning unit. Each A/D conversion circuit 30 includes a comparison unit 31 and a latch unit 32.

The comparison unit 31 compares the voltage of the pixel signal generated by the pixel in the corresponding column of the pixel array unit 10 with the ramp wave Ramp from a timing at which the A/D conversion circuit 30 starts the A/D conversion, and outputs a timing at which the multiphase clock CK and the count value CNT are held (latched), to the latch unit 32. The comparison unit 31 includes a comparator 311 and a latch control circuit 312.

The comparator 311 performs comparison of a voltage of the pixel signal that is an A/D conversion target input from any one pixel of the corresponding column in the pixel array unit 10 with a voltage of the ramp wave Ramp input from the ramp signal generation unit 40. More specifically, in the comparator 311, the pixel signal output from the pixel is input to a positive input terminal, and the ramp wave Ramp is input to a negative input terminal. When a magnitude of the voltage of the pixel signal input to the positive input terminal coincides with a magnitude of the voltage of the ramp wave Ramp input to the negative input terminal, the comparator 311 inverts a comparison result signal that is output from an output terminal to the latch control circuit 312.

The latch control circuit 312 outputs a latch timing signal to each latch circuit included in the latch unit 32 at a timing at which the comparison result signal input from the comparator 311 is inverted. The latch timing signal is a signal indicating a timing at which each latch circuit included in the latch unit 32 holds (latches) a logical state (signal level) of the corresponding multiphase clock CK, that is, phase information caused to be held in the reference clock, and the count value, and is a pulse signal that is at a signal level indicating that the phase information or the count value is latched only for a predetermined short period. Because a period (hereinafter referred to as a "latch execution period") in which the latch timing signal latches the phase information or the count value is shortened, each latch circuit included in the latch unit 32 operates during a short latch execution period, making it possible to suppress power consumption when the A/D conversion circuit 30 performs A/D conversion.

The latch unit 32 holds (latches) the signal levels of the respective multiphase clocks CK output from the multiphase clock generation unit 501 in the clock generation unit 50 and the count value CNT output from the counting unit 502 in the clock generation unit 50 according to the latch timing signal output from the latch control circuit 312. The latch unit 32 includes a plurality of latch circuits 321 corresponding to the respective multiphase clocks CK output from the multiphase clock generation unit 501 in the clock generation unit 50, and a latch circuit 322 that latches the count value CNT output from the counting unit 502 in the clock generation unit 50. In the solid-state imaging device 1 shown in FIG. 1, a configuration in which n (n is an integer equal to or greater than 2) latch circuits 321-1 to 321-n that latch the signal levels of the corresponding multiphase clocks CK-1 to CK-n, corresponding to n types of respective multiphase clocks CK-1 to CK-n, and a latch circuit 322 that latches the count value CNT are included.

Each of the latch circuit 321 and the latch circuit 322 operates during the latch execution period according to the latch timing signal output from the latch control circuit 312 in the comparison unit 31, and latches a signal level of the multiphase clock CK (phase information) in operation and the value of the count value CNT. Each of the latch circuits 321-1 to 321-n and the latch circuit 322 stops the operation during a signal level in which the latch timing signal indicates that a period is not a period in which the phase information or the count value is latched, that is, a period other than a latch execution period.

Each A/D conversion circuit 30 sets the value of the count value CNT latched by the latch circuit 322 in the latch unit 32 as upper bits of the digital value of the pixels subjected to the A/D conversion, sets the signal level of the multiphase clocks CK 1 to CK-n latched by the latch circuits 321-1 to 321-n as lower bits of the digital value of the pixels subjected to the A/D conversion, and outputs a result thereof.

With this configuration, the A/D conversion circuit 30 is possible to improve resolution of the A/D conversion using the phase information that is caused to be included in the reference clock, similar to the A/D conversion circuit of an SS+TDC type A/D conversion scheme of the related art.

Each of the A/D conversion circuits 30 includes, for example, an encoding unit that encodes signal levels (phase information) of the multiphase clocks CK1 to CK-n latched in the respective latch circuits 321-1 to 321-n, and generates a digital value indicated by the phase information, that is, a digital value of lower bits (lower bits of the digital value of the pixel) according to a magnitude of the pixel signal, illustration of components such as the encoding unit in FIG. 1 is omitted.

The column A/D conversion unit 20 includes a plurality of repeater circuits 21 and a plurality of repeater circuits 22 for every predetermined number of A/D conversion circuits 30, that is, for every plurality of predetermined columns of A/D conversion circuits 30 of the pixel array unit 10.

Each of the repeater circuits 21 correspond to a predetermined number of A/D conversion circuits 30, and relay and transfer the respective multiphase clocks CK output from the multiphase clock generation unit 501 in the clock generation unit 50 to the respective corresponding A/D conversion circuits 30. By transferring the respective multiphase clocks CK to the A/D conversion circuits 30 via the respective repeater circuits 21, the signal level of the multiphase clock CK, that is, the phase information caused to be held in the reference clock, is accurately transferred to the latch circuit 321 in the A/D conversion circuit 30 of all the columns included in the column A/D conversion unit 20.

The repeater circuits 21 corresponding to the number obtained by dividing the number of columns of pixels included in the pixel array unit 10 by the number of A/D conversion circuits 30 corresponding to one repeater circuit 21 are included by types of multiphase clocks CK in the column A/D conversion unit 20. In FIG. 1, it is shown that the solid-state imaging device 1 is configured as that the A/D conversion circuits 30 included in the column A/D conversion unit 20 are divided into m sets (m is an integer equal to or greater than 2) for every predetermined number of A/D conversion circuits 30, and the repeater circuits 21 corresponding to n types of multiphase clocks CK-1 to CK-n are included in each group. More specifically, in FIG. 1, it is shown that the solid-state imaging device 1 is configured to include the repeater circuits 211-1 to 211-$n$ corresponding to the first group of A/D conversion circuits 30, the repeater circuits 212-1 to 212-$n$ corresponding to the second group of A/D conversion circuits 30, and the repeater circuits 21$m$-1 to 21$m$-$n$ corresponding to the m-th group of A/D conversion circuits 30.

Each of the repeater circuits 21 includes one or a plurality of repeater units. The repeater unit includes a buffer circuit. The repeater unit may include one buffer circuit or may include a plurality of buffer circuits. In FIG. 1, the repeater unit included in the repeater circuit 21 is indicated by a symbol of a buffer.

More specifically, each of the repeater circuits 21 includes a repeater unit that transfers the multiphase clock CK to the latch circuit 321 in the corresponding A/D conversion circuit 30, and a repeater unit that transfers the multiphase clock CK to the repeater circuit 21 in the next stage. Since the repeater circuit 21 in a last stage does not transfer the multiphase clocks CK to the repeater circuit 21 in the next stage, the repeater circuit 21 in the last stage is configured to include only one repeater unit. For example, the repeater circuit 211-1 in the first stage corresponding to the multiphase clocks CK1 includes a repeater unit that transfers the multiphase clock CK-1 to the latch circuit 321-1 of the A/D conversion circuit 30 in the first corresponding group, and a repeater unit that transfers the multiphase clock CK-1 to the repeater circuit 212-1 in the second stage. Further, for example, since the repeater circuit 21$m$-1 in the last stage corresponding to the multiphase clock CK1 does not transfer the multiphase clock CK to the repeater circuit 21 in the next stage, only one repeater unit is included.

Each of the repeater circuits 22 corresponds to a predetermined number of A/D conversion circuits 30, and each of the circuits 22 relays and transmits the count value CNT output from the counting unit 502 in the clock generation unit 50 to the corresponding A/D conversion circuits 30. By transmitting the count value CNT to the A/D conversion circuits 30 via the respective repeater circuits 22, the value of the count value CNT is accurately transmitted to the latch circuits 322 of the A/D conversion circuits 30 of all the columns included in the column A/D conversion unit 20.

The repeater circuits 22 corresponding to the number obtained by dividing the number of columns of pixels included in the pixel array unit 10 by the number of A/D conversion circuits 30 corresponding to one repeater circuit 22 are included in the column A/D conversion unit 20. A configuration is shown in which, in the solid-state imaging device 1 shown in FIG. 1, the A/D conversion circuits 30 included in the column A/D conversion unit 20 are divided into m groups (m is an integer equal to or greater than 2) for every predetermined number of A/D conversion circuits 30, and the repeater circuits 221 to 22$m$ corresponding to the respective groups are included. In the column A/D conversion unit 20, a plurality of repeater circuits 22 corresponding to respective bits indicating the value of the count value CNT are included for each group, but respective bits of the count value CNT are collected and shown as the repeater circuits 221 to 22$m$ in the respective groups in FIG. 1. That is, illustration of the repeater circuits 22 corresponding to the respective bits of the count value CNT in each group is omitted in FIG. 1.

Each of the repeater circuits 22 includes one or a plurality of repeater units, similar to the repeater circuit 21. In FIG. 1, the repeater unit included in the repeater circuit 22 is indicated by a symbol of a buffer.

More specifically, each of the repeater circuits 22 includes a repeater unit that transfers the count value CNT to the latch circuit 322 in the corresponding A/D conversion circuit 30, and a repeater unit that transfers the count value CNT to the repeater circuit 22 in the next stage. Since the repeater circuit 22 in the last stage does not transfer the count value CNT to the repeater circuit 22 in the next stage, similar to the repeater circuit 21 in the last stage, the repeater circuit 22 in the last stage is configured to include only one repeater unit. For example, the repeater circuit 221 in the first stage includes a repeater unit that transfers the count value CNT to the latch circuit 322 in the A/D conversion circuit 30 in the first corresponding group, and a repeater unit that transfers the count value CNT to the repeater circuit 222 in the second stage. Further, for example, since the repeater circuit 22$m$ in the last stage does not transfer the count value CNT to the repeater circuit 22 in the next stage, the repeater circuit 22$m$ is configured to include only one repeater unit.

(Arrangement According to First Embodiment)

An arrangement of the A/D conversion circuit 30, the repeater circuit 21, and the repeater circuit 22 within the column A/D conversion unit 20 in the solid-state imaging device 1 is described below. Generally, since the respective latch circuits are arranged side by side in the same direction as a direction of a column of pixels (a column direction or a vertical direction) included in the pixel array unit, the A/D conversion circuit of an SS+TDC type A/D conversion scheme has a region that is long in the column direction, but can be formed with a region having a width narrower than an interval of two pixels arranged adjacent in a direction of a row (row direction or a horizontal direction), that is, a pixel pitch of the pixels included in the pixel array unit. That is, a region for forming the A/D conversion circuit of an SS+TDC type A/D conversion scheme has a margin in the horizontal direction. Thus, the A/D conversion circuit 30 included in the column A/D conversion unit 20 can also be formed with a width narrower than the pixel pitch of the pixels included in the pixel array unit 10. In a solid-state imaging device of the related art, even when the A/D conversion circuit of an SS+TDC type A/D conversion scheme can be formed in a region having a width narrower than a pixel pitch, particularly, shortening and formation of regions of respective A/D conversion circuits of an SS+TDC type A/D conversion scheme are not performed.

On the contrary, in the solid-state imaging device 1, as shown in FIG. 1, the predetermined number of A/D conversion circuits 30 are set as one group and the regions of the A/D conversion circuits 30 are shortened and formed in a horizontal direction for each group. Accordingly, in the solid-state imaging device 1, a region for arranging the corresponding repeater circuit 21 and the corresponding repeater circuit 22 in the column direction is secured for each group. As shown in FIG. 1, the repeater circuit 21 and the repeater circuit 22 are formed in the secured region. The repeater circuits 21 and the repeater circuits 22 that transfer the same signal to the A/D conversion circuits 30 belonging to each group are connected in series. Thus, in the solid-state imaging device 1, the repeater circuit 21, the repeater circuit 22, and the A/D conversion circuit 30 are formed in the column A/D conversion unit 20. That is, in the solid-state imaging device 1, the repeater circuit 21 and the repeater circuit 22 are formed in a region that is empty by shortening and forming the regions of the A/D conversion circuits 30 rather than a position opposite to the pixel array unit 10 with the sandwiched A/D conversion circuit 30 or a position between the latch circuits 321 and the latch circuit 322, as in the solid-state imaging device to which the related art has been applied.

In the solid-state imaging device 1, even when the number of pixels included in the pixel array unit 10 is increased, the multiphase clock CK and the count value CNT can be accurately transferred to each A/D conversion circuit 30 by the repeater circuit 21 and the repeater circuit 22 by forming the A/D conversion circuit 30, the repeater circuit 21, and the repeater circuit 22 in such a manner. Further, in the solid-state imaging device 1, even when the repeater circuit 21 and the repeater circuit 22 are formed with the increasing number of pixels included in the pixel array unit 10, a length of a signal wiring for transferring the multiphase clock CK or the count value CNT to the latch circuit 321 and the latch circuit 322 in the A/D conversion circuit 30 can be shortened. Further, in the solid-state imaging device 1, even when the repeater circuit 21 and the repeater circuit 22 are formed with the increasing number of pixels included in the pixel array unit 10, a length of a signal wiring for transferring a latch timing signal output by the latch control circuit 312 of the comparison unit 31 to the latch circuit 321 and the latch circuit 322 in the A/D conversion circuit 30 can be shortened.

In the solid-state imaging device 1, a load when the latch control circuit 312 outputs the latch timing signal is set to be the same as in a solid-state imaging device in which the number of pixels included in the pixel array unit 10 is not increased, and then repeater units for corresponding to the increase in number of pixels can be included. In the solid-state imaging device 1, even when the number of pixels is increased, it is possible to improve resolution of digital values of the respective pixels to be output without degrading accuracy of the A/D conversion.

(First Power Wiring-Forming Method According to First Embodiment)

In the solid-state imaging device 1, each of the repeater circuit 21 and the repeater circuit 22 transfers the multiphase clock CK and the count value CNT to the latch circuit 321 and the latch circuit 322 of the A/D conversion circuit 30 from a timing at which each A/D conversion circuit 30 starts A/D conversion. In other words, in the solid-state imaging device 1, each of the repeater circuit 21 and the repeater circuit 22 always transfers the multiphase clock CK and the count value CNT to the corresponding latch circuit 321 and the corresponding latch circuit 322 while each A/D conversion circuit 30 is performing the A/D conversion.

On the contrary, in the solid-state imaging device 1, each of the latch circuit 321 and the latch circuit 322 in the A/D conversion circuit 30 operates during a latch execution period according to the latch timing signal output from the latch control circuit 312 in the comparison unit 31, that is, a predetermined short period. Accordingly, in the solid-state imaging device 1, power consumption instantaneously increases at a timing at which the latch circuit 321 and the latch circuit 322 latch the multiphase clock CK and the count value CNT in each A/D conversion circuit 30. Due to the instantaneous change in power consumption, power may fluctuate when the latch circuit 321 and the latch circuit 322 operate. When variation in the power when the latch circuit 321 and the latch circuit 322 operate interferes with the power for the repeater circuit 21 and the repeater circuit 22, the multiphase clock CK and the count value CNT that are transferred may be affected. In particular, when variation in power when the latch circuit 321 operates affects the power for the repeater circuit 21, accuracy when the multiphase clock CK is transferred is degraded. For example, the multiphase clock CK transferred by the repeater circuit 21 is delayed. Phase information is changed in some cases. This causes degradation of accuracy of the A/D conversion in the A/D conversion circuit 30 using the multiphase clock CK transferred by the repeater circuit 21, that is, degradation of the resolution.

It is necessary for the variation in the power when the latch circuit 321 and the latch circuit 322 operate not to affect the power for the repeater circuit 21 and the repeater circuit 22, that is, it is necessary for the respective powers not to interfere. Therefore, it is preferable that a wiring for the power for the latch circuit 321 and the latch circuit 322 be separated from a wiring for the power for the repeater circuit 21 and the repeater circuit 22, and that the wirings of the respective powers be arranged to not to interfere with each other.

Figure 2:
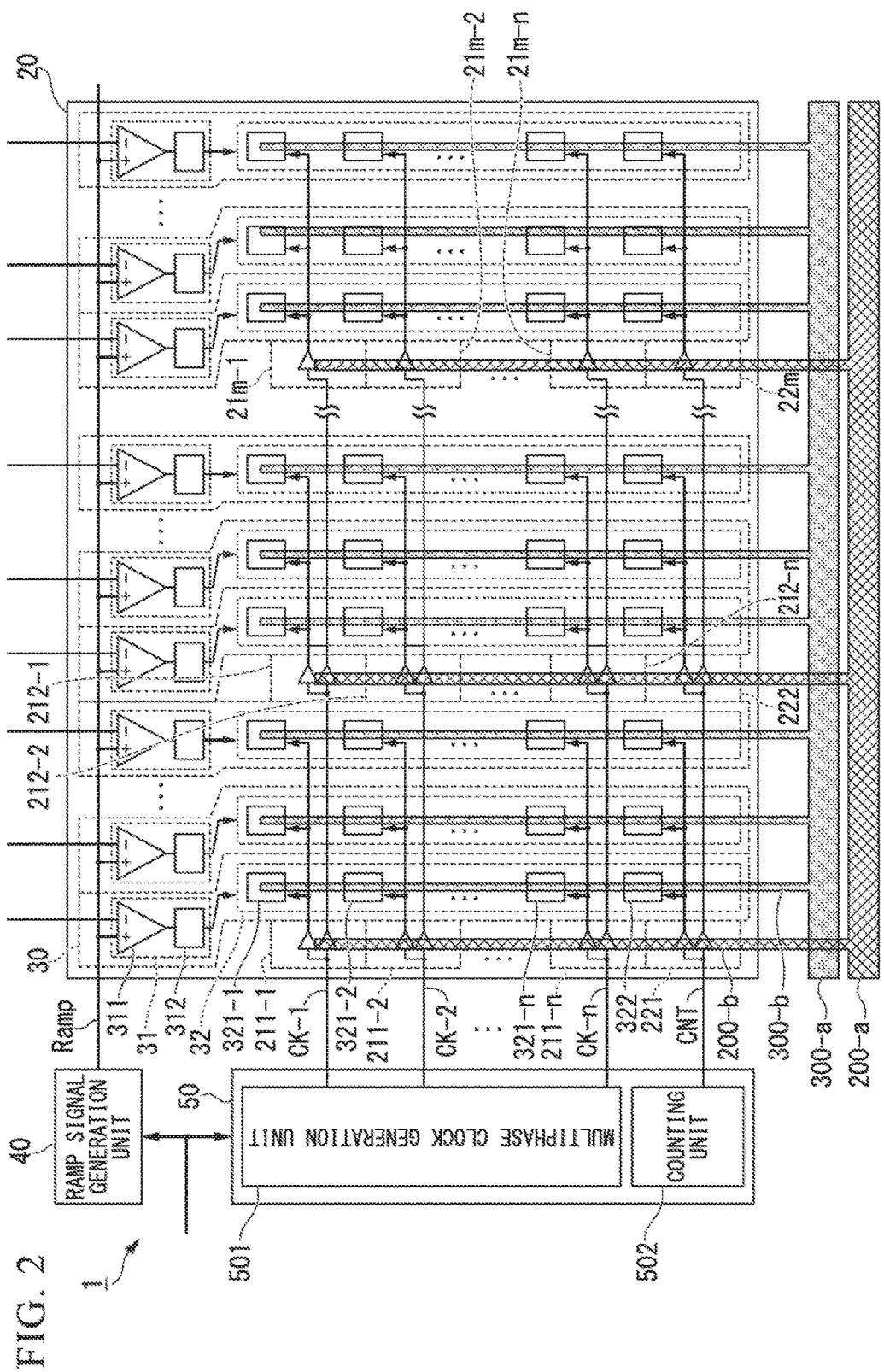
FIG. 2 is a diagram showing an example of a first method of forming a power wiring in the solid-state imaging device according to the first embodiment of the present invention.

Next, a method of forming power wirings for supplying power to the A/D conversion circuit 30, the repeater circuit 21, and the repeater circuit 22 within the column A/D conversion unit 20 in the solid-state imaging device 1 will be described. FIG. 2 is a diagram showing an example of a first method of forming power wirings (first power wiring-forming method) in the solid-state imaging device 1 of the first embodiment of the present invention. FIG. 2 shows an example of a wiring for supplying power to the A/D conversion circuit 30 and a wiring for supplying power to each of the repeater circuit 21 and the repeater circuit 22 in the configuration of the solid-state imaging device 1 shown in FIG. 1. In FIG. 2, illustration of the pixel array unit 10 included in the solid-state imaging device 1 will be omitted.

The first power wiring-forming method in the solid-state imaging device 1 is a method of forming a power wiring for supplying power in each column of the A/D conversion circuit 30, the repeater circuit 21, and the repeater circuit 22 formed in the column A/D conversion unit 20.

More specifically, as shown in FIG. 2, a power wiring for supplying power to the respective components included in the A/D conversion circuit 30, that is, each sub-wiring (hereinafter referred to as an "A/D vertical power wiring") 300-*b*, is formed to extend in the column direction (vertical direction) at a position corresponding to the column in which each A/D conversion circuit 30 has been formed from the main-wiring (hereinafter referred to as an "A/D horizontal power wiring") 300-*a* formed in the row direction (the horizontal direction). Further, as shown in FIG. 2, a power wiring for supplying power to the respective repeater units included in the repeater circuit 21 and the repeater circuit 22, that is, each sub-wiring (hereinafter referred to as a "repeater vertical power wiring") 200-*b*, is formed to extend in the column direction (vertical direction) at a position corresponding to the column in which the repeater circuit 21 and the repeater circuit 22 have been formed from the main-wiring (hereinafter referred to as a "repeater horizontal power wiring") 200-*a* formed in the row direction (the horizontal direction). In this case, a region for forming the repeater vertical power wiring 200-*b* and the region for forming the A/D vertical power wiring 300-*b* do not overlap.

Power is supplied to each of the A/D conversion circuit 30, the repeater circuit 21, and the repeater circuit 22 by the sub-wiring. More specifically, power is supplied to each of the components included in the A/D conversion circuit 30 by the corresponding A/D vertical power wiring 300-*b*. Further, power is supplied to each of the repeater units included in the repeater circuit 21 and the repeater circuit 22 by the corresponding repeater vertical power wiring 200-*b*.

By forming the sub-wirings as the power wirings for supplying power to the A/D conversion circuit 30, the repeater circuit 21, and the repeater circuit 22 as in the first power wiring-forming method shown in FIG. 2, power not affected by fluctuation in the power when the latch circuit 321 and the latch circuit 322 included in the respective A/D conversion circuits 30 operate can be supplied to each of the repeater circuit 21 and the repeater circuit 22.

Since the wiring of GND of the A/D conversion circuit 30 and the wirings of respective GNDs of the repeater circuit 21 and the repeater circuit 22 can be considered to be similar to the respective power wirings shown in FIG. 2, detailed description of the respective GND wirings is omitted.

In the solid-state imaging device in which the latch circuit and the buffer circuit are alternately arranged by applying the technology of the related art, the power wirings for supplying power to the latch circuit and the buffer circuit can be separated. However, in the solid-state imaging device to which the related art has been applied, when respective power wirings are formed as in the first power wiring-forming method shown in FIG. 2, both of a power wiring for supplying power to the buffer circuit and a power wiring for supplying power to the latch circuit are formed in a column around the region in which the buffer circuit is formed, and thus it is necessary to decrease the width of the respective power wirings. If the width of the power wiring is small, voltage drop of the power to be supplied is increased due to an increase in wiring resistance, and an operation of a circuit to which power is supplied using a narrow power wiring may be disturbed. Further, in the solid-state imaging device to which the related art is applied, when one of the power wirings is formed to extend in the vertical direction and the other power wiring is formed to extend in the horizontal direction, it is possible to increase a width of the respective power wirings, unlike the first power wiring-forming method shown in FIG. 2. However, in this case, since one power wiring and the other power wiring intersect at a plurality of positions, fluctuation of the power when the latch circuit operates due to parasitic capacitance between the respective power wirings affects the power for the buffer circuit, accuracy of A/D conversion is degraded, and the resolution is degraded.

On the contrary, in the solid-state imaging device 1, as shown in FIG. 2, the sub-wiring formed to extend from the other main-wiring intersects in the region of the main-wiring (intersects the repeater vertical power wiring 200-*b* in the region of the A/D horizontal power wiring 300-*a* in an example of the first power wiring-forming method shown in FIG. 2), but the respective sub-wirings do not intersect each other. Therefore, in the solid-state imaging device 1, even when the power supplied to the latch circuit 321 and the latch circuit 322 fluctuates, the variation does not affect the power that is supplied to each of the repeater circuit 21 and the repeater circuit 22.

In the solid-state imaging device 1, since the repeater circuits 21 and the repeater circuit 22 are formed in a region that is empty by shortening and forming the A/D conversion circuit 30, a length of a region in the column direction of the A/D conversion circuit 30 is shorter than a length of a region in a column direction of an A/D conversion circuit in a solid-state imaging device of the related art in which a latch circuit and a buffer circuit are alternately arranged. Thus, as shown in FIG. 2, a width in a column direction of the region of the main-wiring can be increased. Thus, in the solid-state imaging device 1, it is possible to reduce wiring resistance of the main-wiring and suppress voltage drop of power to be supplied. Further, in the solid-state imaging device 1, even when the power supplied by the sub-wiring intersecting the region of the main-wiring fluctuates, fluctuation does not affect the power supplied by the main-wiring.

(Second Power Wiring-Forming Method According to First Embodiment)

Figure 3:
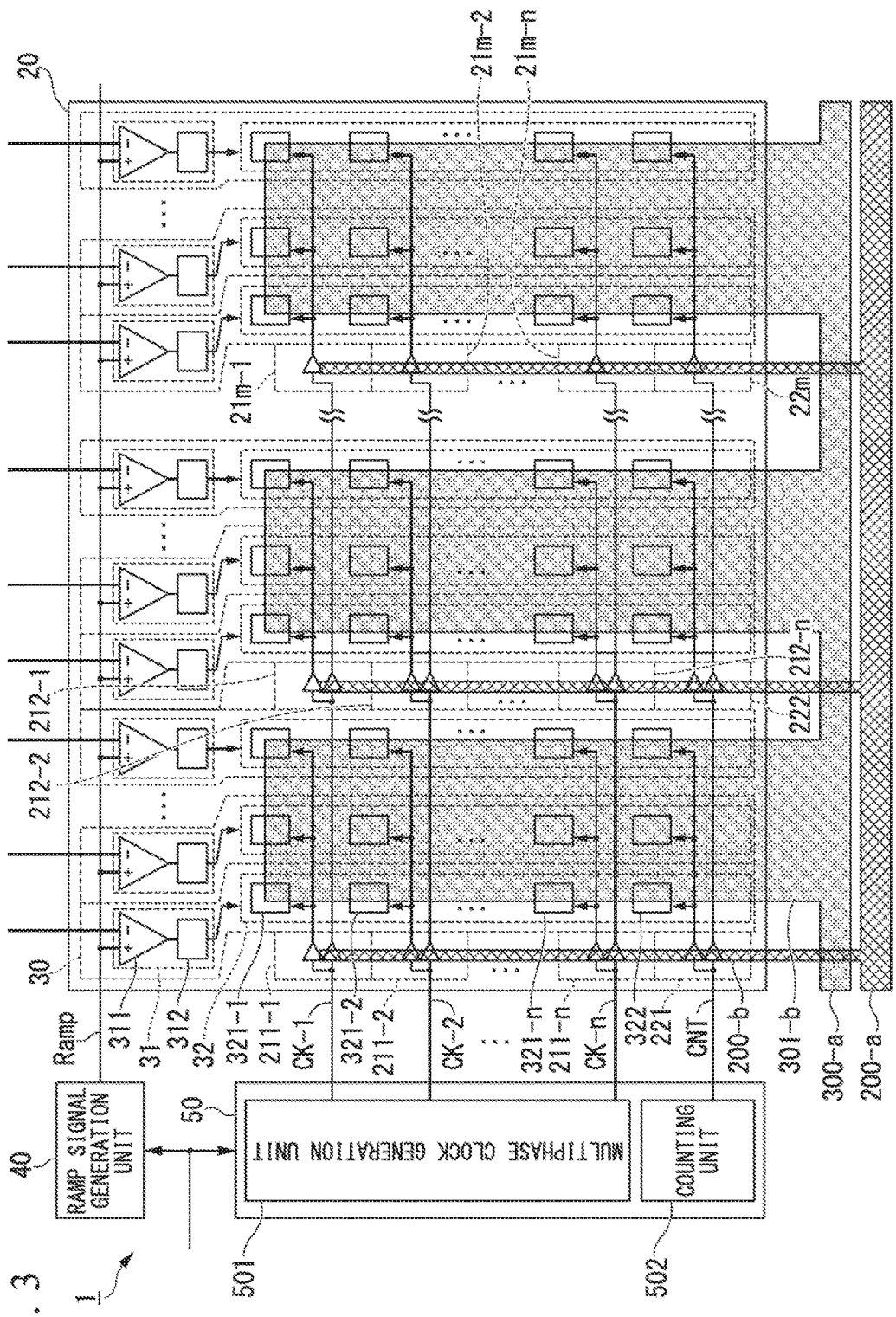
FIG. 3 is a diagram showing an example of a second method of forming a power wiring in the solid-state imaging device according to the first embodiment of the present invention.

Next, another method of forming a wiring for supplying power to the A/D conversion circuit 30, the repeater circuit 21, and the repeater circuit 22 within the column A/D conversion unit 20 in the solid-state imaging device 1 will be described. FIG. 3 is a diagram showing an example of the second method of forming a power wiring (a second power wiring-forming method) in the solid-state imaging device 1 of the first embodiment of the present invention. FIG. 3 shows an example of a wiring for supplying power to the A/D conversion circuit 30 and a wiring for supplying power to each of the repeater circuit 21 and the repeater circuit 22 in the configuration of the solid-state imaging device 1 shown in FIG. 1, similarly to the first power wiring-forming method shown in FIG. 2. In FIG. 3, illustration of the pixel array unit 10 included in the solid-state imaging device 1 will be omitted.

In the first power wiring-forming method shown in FIG. 2, the A/D vertical power wiring 300-*b* that is a sub-wiring for supplying power to the respective A/D conversion circuits 30 in the same set (group) has been formed from a position corresponding to the column in which each A/D conversion circuit 30 has been formed. On the contrary, the second power wiring-forming method is a method of forming a sub-wiring common to the respective A/D conversion circuits 30 in the same set (group). That is, the second power wiring-forming method is a method of collecting and forming the respective sub-wirings for supplying power to the A/D conversion circuits 30 belonging to the same group.

More specifically, as shown in FIG. 3, a common sub-wiring (A/D vertical power wiring) 301-*b* is formed to extend in the column direction (the vertical direction) at positions corresponding to a plurality of columns in which the respective A/D conversion circuits 30 belonging to the same group have been formed from the A/D horizontal power wiring 300-*a* that is the main-wiring formed in the row direction (the horizontal direction) similarly to the first power wiring-forming method shown in FIG. 2. Accordingly, the power is supplied to the respective components included in the A/D conversion circuits 30 belonging to the same group by a common A/D vertical power wiring 301-*b*.

In the second power wiring-forming method, a method of forming the repeater horizontal power wiring 200-*a* and the repeater vertical power wiring 200-*b* that supply power to the repeater circuit 21 and the repeater circuit 22 is the same as the method of forming the first power wiring shown in FIG. 2.

As in the second power wiring-forming method shown in FIG. 3, by forming the common sub-wiring as the power wiring for supplying power to each of the A/D conversion circuits 30 belonging to the same group, a width in the row direction of the region of the sub-wiring can be increased. Thus, in the solid-state imaging device 1, it is possible to reduce wiring resistance of the sub-wiring and suppress voltage drop of the power to be supplied.

By forming the power wirings for supplying power to the A/D conversion circuit 30, the repeater circuit 21, and the repeater circuit 22 as shown in FIG. 3, power not affected by fluctuation in the power when the latch circuit 321 and the latch circuit 322 included in the respective A/D conversion circuits 30 operate can be supplied to each of the repeater circuit 21 and the repeater circuit 22, similar to the first power wiring-forming method shown in FIG. 2.

Although the case in which the respective sub-wirings for supplying power to all of the A/D conversion circuits 30 belonging to the same group are collected and formed in the second power wiring-forming method is shown in FIG. 3, sub-wirings may be collected and formed for the predetermined number of A/D conversion circuits 30 rather than all the A/D conversion circuits 30 belonging to the same group.

Since the wiring of GND of the A/D conversion circuit 30 and the wirings of respective GNDs of the repeater circuit 21 and the repeater circuit 22 can be considered to be similar to the respective power wirings shown in FIG. 2, detailed description of the respective GND wirings is omitted.

According to the first embodiment, a solid-state imaging device (the solid-state imaging device 1) is configured, including a pixel array unit (the pixel array unit 10) in which a plurality of pixels outputting an analog pixel signal according to the quantity of incident light are arranged in a two-dimensional matrix form, the pixel array unit outputting a pixel signal that is output by the pixel arranged in each column, for each row; a ramp signal generation unit (the ramp signal generation unit 40) that generates and outputs a ramp wave (the ramp wave Ramp) that is an analog reference voltage that monotonically decreases or monotonically increases at a constant rate with respect to time; a clock generation unit (the clock generation unit 50) that generates and outputs multiphase clocks (the multiphase clocks CK-1 to CK-n) obtained by changing a phase of a clock serving as a reference (the reference clock) into another phase; a signal-processing unit (the column A/D conversion unit 20) including a plurality of analog-to-digital conversion circuits (the A/D conversion circuits 30), the analog-to-digital conversion circuit being arranged in respective columns of the pixels arranged in the pixel array unit 10 or in every plurality of columns, performing analog-to-digital conversion on the pixel signal output by the pixel of the corresponding column according to the multiphase clocks CK-1 to CK-n, and outputting a digital value according to magnitude of the pixel signal (the digital value of the pixel), wherein the column A/D conversion unit 20 further includes a plurality of repeater circuits (the repeater circuits 21) that correspond to a plurality of respective sets (groups) into which the plurality of A/D conversion circuits 30 are divided for every predetermined number of A/D conversion circuits 30 and relay and transfer a plurality of respective multiphase clocks CK-1 to CK-n to the respective A/D conversion circuits 30 belonging to the corresponding groups, each A/D conversion circuit 30 includes a comparison unit (the comparison unit 31) that compares the voltage of the pixel signal with the ramp wave Ramp and outputs a timing signal according to a result of comparison, and a latch unit (the latch unit 32) in which a plurality of latch circuits (the latch circuits 321) that hold a state of each phase of the multiphase clocks CK-1 to CK-n transferred by the corresponding repeater circuits 21 according to a timing signal are arranged side by side in the column direction, each latch circuit 321 arranged in the latch unit 32 outputs the digital value of the pixel based on each held state of the phase, and the respective repeater circuits 21 corresponding to the same group are arranged between the A/D conversion circuits 30 belonging to different groups side by side in the column direction, and the repeater circuits 21 corresponding to the different groups that transfer the respective multiphase clocks CK-1 to CK-n indicating the same phase are connected in series.

According to the first embodiment, the solid-state imaging device 1 is configured in which the column A/D conversion unit 20 is arranged on any one side (lower side) in the column direction of the pixel array unit 10, and a width in the row direction of the region for forming each A/D conversion circuit 30 is smaller than an interval of two pixels arranged adjacent in the row direction in the pixel array unit 10.

According to the first power wiring-forming method of the first embodiment, the solid-state imaging device 1 is configured in which power is supplied to each repeater circuit 21 by the corresponding sub-wiring (the repeater vertical power wiring 200-*b*) formed to extend in the column direction at the respective positions at which the plurality of repeater circuits 21 corresponding to the same group are arranged side by side in the column direction from the main-wiring (the repeater horizontal power wiring 200-*a*) formed in the row direction, and a width in the column direction of the region for forming the repeater horizontal power wiring 200-*a* is greater than the width in the row direction of the region for forming each repeater vertical power wiring 200-*b*.

According to the first power wiring-forming method of the first embodiment, the solid-state imaging device 1 is configured in which power is supplied to each repeater circuit by a corresponding repeater vertical power wiring 200-*b* formed to extend in the column direction at respective positions at which a plurality of repeater circuits corresponding to the same group are arranged side by side in the column direction from the repeater horizontal power wirings 200-*a* formed in the row direction, and the region for forming each repeater vertical power wiring 200-*b* does not overlap the region of the power wiring for supplying power to each latch circuit.

According to the first power wiring-forming method of the first embodiment, the solid-state imaging device 1 is configured in which power is supplied to each latch circuit by the corresponding sub-wiring (the A/D vertical power wiring 300-*b*) formed to extend in the column direction at the respective positions at which the plurality of latch circuits included in the same A/D conversion circuit 30 are arranged side by side in the column direction from the main-wiring (the A/D horizontal power wirings 300-*a*) formed in the row direction, and a width in the column direction of the region for forming the A/D horizontal power wiring 300-*a* is greater than the width in the row direction of the region for forming the respective A/D vertical power wiring 300-*b*.

According to the first power wiring-forming method of the first embodiment, the solid-state imaging device 1 is configured in which power is supplied to each latch circuit by the corresponding A/D vertical power wiring 300-*b* formed to extend in the column direction at the respective positions at which the plurality of latch circuits included in the same A/D conversion circuit 30 are arranged side by side in the column direction from the A/D horizontal power wirings 300-*a* formed in the row direction, and the region for forming each A/D vertical power wiring 300-*b* does not overlap the region of the power wiring for supplying power to each repeater circuit.

According to the second power wiring-forming method of the first embodiment, the solid-state imaging device 1 is configured in which the respective A/D vertical power wirings 300-*b* are formed by collecting the A/D vertical power wirings 300-*b* corresponding to the respective latch circuits 321 included in a predetermined number of A/D conversion circuits 30 (A/D vertical power wirings 301-*b*) belonging to the same group.

In the solid-state imaging device 1 of the first embodiment, the regions of the A/D conversion circuits 30 are shortened and formed in each group of the predetermined number of A/D conversion circuits 30, and the repeater circuit 21 and the repeater circuit 22 corresponding to each group are formed in an empty region. Accordingly, in the solid-state imaging device 1 of the first embodiment, even when the number of pixels included in the pixel array unit 10 increases, the signal level of the multiphase clock CK, that is, the phase information caused to be held in the reference clock or the value of the count value CNT, can be accurately transferred to the latch circuit 321 and the latch circuit 322 in the A/D conversion circuit 30 of all the columns included in the column A/D conversion unit 20 by forming the repeater circuit 21 and the repeater circuit 22. Thus, in the solid-state imaging device 1 of the first embodiment, even when the number of pixels is increased, it is possible to improve resolution of the A/D conversion and output the respective digital values of the pixels of which the resolution is high.

In the solid-state imaging device 1 of the first embodiment, the power for each of the A/D conversion circuit 30, the repeater circuit 21, and the repeater circuit 22 within the column A/D conversion unit 20 is supplied using the sub-wiring formed to extend in the column direction (the vertical direction) at a position corresponding to the column in which each of the A/D conversion circuit 30 or the repeater circuit 21 and the repeater circuit 22 has been formed, from the main-wiring formed in the row direction (the horizontal direction). Thus, in the solid-state imaging device 1 of the first embodiment, when the latch circuit 321 and the latch circuit 322 included in each A/D conversion circuit 30 operate, power not affected by the fluctuation in the power can be supplied to each of the repeater circuit 21 and the repeater circuit 22 even when the power supplied to the A/D conversion circuit 30 fluctuates.

Second Embodiment

Figure 4:
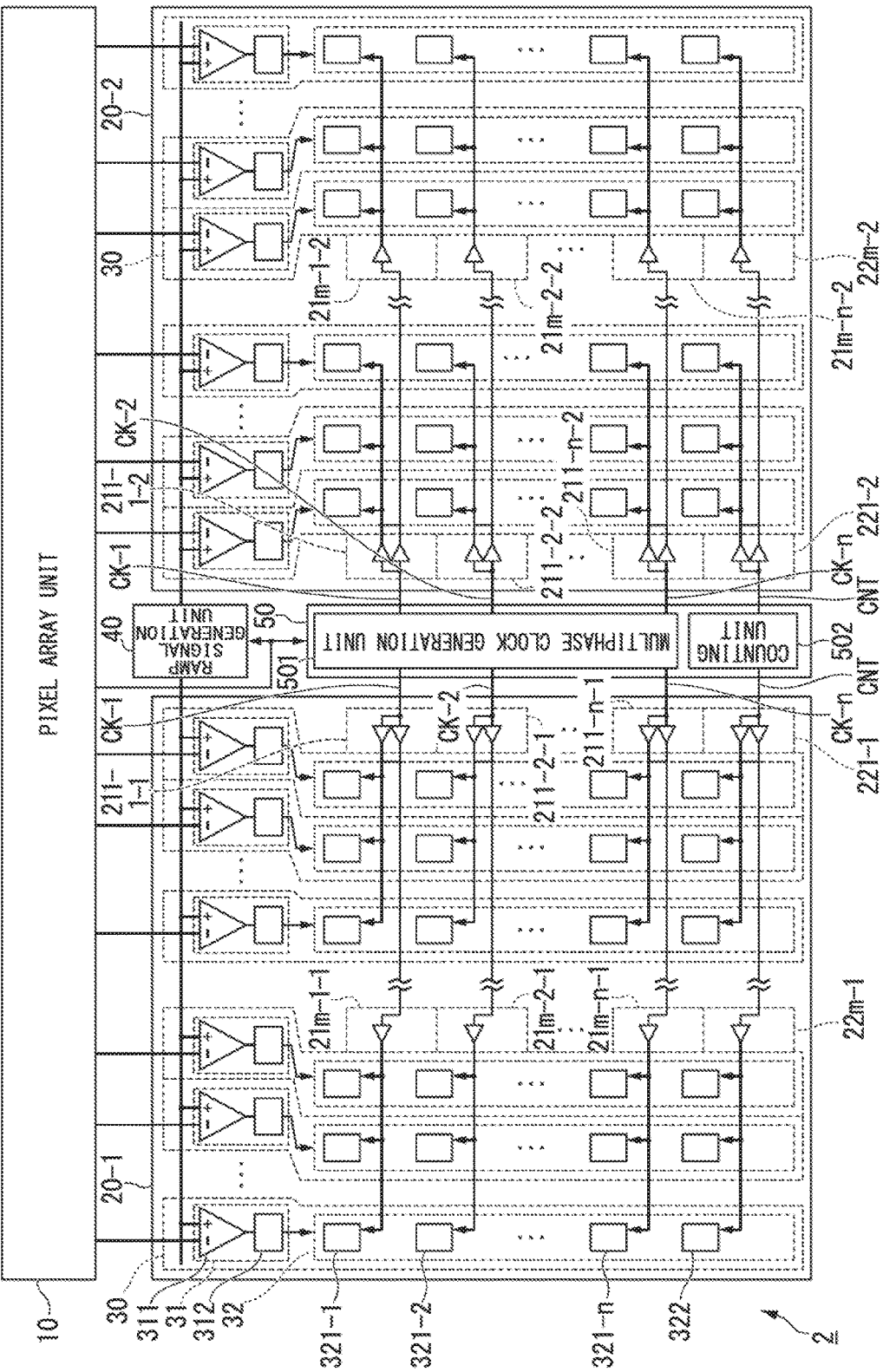
FIG. 4 is a block diagram showing an example of a schematic configuration of a solid-state imaging device according to a second embodiment of the present invention.

Next, a solid-state imaging device of a second embodiment of the present invention will be described. FIG. 4 is a block diagram showing an example of a schematic configuration of the solid-state imaging device of the second embodiment of the present invention. The solid-state imaging device 2 shown in FIG. 4 includes a pixel array unit 10, a column A/D conversion unit 20-1 and a column A/D conversion unit 20-2, a ramp signal generation unit 40, and a clock generation unit 50. In FIG. 4, illustration of components such as the vertical scanning unit, the horizontal scanning unit, and the control unit included in the solid-state imaging device 2 is omitted.

The solid-state imaging device 2 performs A/D conversion on pixel signals of the respective columns output from the respective pixels included in the pixel array unit 10 using the respective A/D conversion circuits 30 that are A/D conversion circuits of an SS+TDC type A/D conversion scheme included in the column A/D conversion unit 20-1 or the column A/D conversion unit 20-2, and sequentially outputs digital values of the pixels, similar to the solid-state imaging device 1 of the first embodiment.

As components of the solid-state imaging device 2 in the second embodiment, the same components as those of the solid-state imaging device 1 of the first embodiment are also included. Therefore, the same components as those of the solid-state imaging device 1 of the first embodiment among the components of the solid-state imaging device 2 in the second embodiment are denoted with the same reference numerals, and detailed description of the respective components will be omitted.

In the solid-state imaging device 2, pixels (columns) included in the pixel array unit 10 is divided into two left and right groups, and two column A/D conversion units 20 (the column A/D conversion unit 20-1 and the column A/D conversion unit 20-2) corresponding to the respective groups are included, as shown in FIG. 4. Therefore, in the solid-state imaging device 2, the ramp signal generation unit 40 and the clock generation unit 50 are arranged at positions between the column A/D conversion unit 20-1 and the column A/D conversion unit 20-2. Although the configuration in which the ramp signal generation unit 40 is arranged at a position between the column A/D conversion unit 20-1 and the column A/D conversion unit 20-2 is shown in FIG. 4, a position at which the ramp signal generation unit 40 is arranged may be, for example, the same position as that of the solid-state imaging device 1 of the first embodiment or may be another position.

In the solid-state imaging device 2, the column A/D conversion unit 20-1 and the column A/D conversion unit 20-2 include a plurality of repeater circuits 21 and a plurality of repeater circuits 22 for each of the A/D conversion circuits 30 of a plurality of predetermined columns. In the following description, the column A/D conversion unit 20-1 and the column A/D conversion unit 20-2 are referred to as a "column A/D conversion unit 20" when the column A/D conversion unit 20-1 and the column A/D conversion unit 20-2 are not distinguished.

A concept when the repeater circuit 21 and the repeater circuit 22 are arranged in each column A/D conversion unit 20 is the same as in the solid-state imaging device 1 of the first embodiment. In the solid-state imaging device 2 shown in FIG. 4, the A/D conversion circuits 30 included in each column A/D conversion unit 20 are divided into m (m is an integer equal to or greater than 2) sets (groups) for the predetermined number of A/D conversion circuits 30, and the repeater circuit 21 and the repeater circuit 22 are included in each group, similar to the solid-state imaging device 1 of the first embodiment.

More specifically, the solid-state imaging device 2 shown in FIG. 4 includes repeater circuits 211-1-1 to 211-*n*-1 and a repeater circuit 221-1 corresponding to a first group of A/D conversion circuits 30 in the column A/D conversion unit 20-1, and repeater circuits 21*m*-1-1 to 21*m*-*n*-1 and a repeater circuit 22*m*-1 corresponding to a m-th group of A/D conversion circuits 30. Further, the solid-state imaging device 2 shown in FIG. 4 includes repeater circuits 211-1-2 to 211-*n*-2 and a repeater circuit 221-2 corresponding to a first group of A/D conversion circuits 30 in the column A/D conversion unit 20-2, and repeater circuits 21*m*-1-2 to 21*m*-*n*-2 and a repeater circuit 22*m*-2 corresponding to a m-th group of A/D conversion circuits 30.

In the solid-state imaging device 2, the columns of the pixels included in the pixel array unit 10 are divided into two right and left groups, as described above. Thus, in the solid-state imaging device 2, in the column A/D conversion unit 20 when a configuration in which the repeater circuit 21 and the repeater circuit 22 are not included is considered, it is possible to shorten a length of the signal wiring for transferring the multiphase clocks CK and the count value CNT to each of the A/D conversion circuits 30. Thus, in the solid-state imaging device 2, the number (the number of stages) of repeater circuits 21 and repeater circuits 22 included in each column A/D conversion unit 20 can be smaller than that of A/D conversion units 20 included in the solid-state imaging device 1 of the first embodiment.

More specifically, in the solid-state imaging device 2, since the columns of the pixels included in the pixel array unit 10 are divided into two groups, and the corresponding column A/D conversion unit 20 is arranged in each group, the number of included A/D conversion circuits 30 is reduced in each column A/D conversion unit 20. Therefore, in the solid-state imaging device 2, the number of stages of the repeater circuit 21 and the repeater circuit 22 included in each column A/D conversion unit 20 can be at least ½ of the number of the column A/D conversion units 20 included in the solid-state imaging device 1 of the first embodiment. Thus, in the solid-state imaging device 2, a cumulative value of a delay due to the repeater circuit 21 or the repeater circuit 22 in a plurality of stages from a first stage to a last stage (a delay from an input terminal to an output terminal of each buffer circuit), which appears as a fluctuation (jitter) when each of the multiphase clocks CK and the count value CNT is transferred, can be smaller than that in the column A/D conversion unit 20 included in the solid-state imaging device 1 of the first embodiment. Thus, the phase information indicated by the multiphase clock CK and the count value CNT can be more accurately transferred to the latch circuit 321 and the latch circuit 322 of the A/D conversion circuit 30 of all the columns included in the respective column A/D conversion units 20.

The method of forming the power wiring and the GND wiring for supplying power to the A/D conversion circuit 30, the repeater circuit 21, and the repeater circuit 22 included in each of the column A/D conversion unit 20 is the same as in the solid-state imaging device 1 of the first embodiment. Therefore, detailed description of the method of forming the power wiring and the GND wiring of each column A/D conversion unit 20 in the solid-state imaging device 2 is omitted.

According to the second embodiment, the solid-state imaging device (the solid-state imaging device 2) is configured in which the signal-processing units (the column A/D conversion units 20) are dividedly arranged corresponding to the plurality of respective groups into which the plurality of pixels arranged in the pixel array unit (the pixel array unit 10) are divided for every plurality of predetermined columns of pixels, and the clock generation unit (the clock generation unit 50) is arranged at a position between the signal-processing units (the column A/D conversion unit 20-1 and the column A/D conversion unit 20-2) that are dividedly arranged.

According to the second embodiment, the solid-state imaging device 2 is configured in which in the pixel array unit 10, the plurality of arranged pixels are divided into two groups for each column of pixels, the column A/D conversion units 20 are divided into the first signal-processing units (the column A/D conversion unit 20-1) corresponding to one group, and the second signal-processing units (the column A/D conversion unit 20-2) corresponding to the other group and arranged, and the clock generation unit 50 is arranged at a position between the column A/D conversion unit 20-1 and the column A/D conversion unit 20-2.

According to the second embodiment, the solid-state imaging device 2 is configured in which in the pixel array unit 10, the plurality of arranged pixels are divided into two right and left groups at a position of a central column, the column A/D conversion units 20 are divided into the column A/D conversion unit 20-1 corresponding to the left group and the column A/D conversion unit 20-2 corresponding to the right group and arranged, and the clock generation unit 50 is arranged at a position between the column A/D conversion unit 20-1 and the column A/D conversion unit 20-2.

According to the second embodiment, the solid-state imaging device 2 is configured in which the column A/D conversion units 20 are dividedly arranged into two opposite sides (an upper side and a lower side) in the column direction of the pixel array unit 10 to correspond to the plurality of respective groups into which the plurality of pixels arranged in the pixel array unit 10 are divided for each predetermined column of pixels, and a width in a row direction of the region for forming the respective analog-to-digital conversion circuits (the A/D conversion circuits 30) respectively included in the column A/D conversion unit 20-1 and the column A/D conversion unit 20-2 that are dividedly arranged is greater than an interval between two pixels arranged adjacent in the row direction in the pixel array unit 10 and is smaller than a width in the row direction at which the two pixels arranged adjacent in the row direction are formed.

In the solid-state imaging device 2 of the second embodiment, the columns of the pixels included in the pixel array unit 10 are divided into groups, and therefore, the column A/D conversion units 20 are dividedly arranged. In the respective column A/D conversion units 20, the regions of the A/D conversion circuits 30 are shortened and formed in in each group of the predetermined number of A/D conversion circuits 30, and the repeater circuit 21 and the repeater circuit 22 corresponding to each group are formed in an empty region, as in the solid-state imaging device 1 of the first embodiment. The repeater circuits 21 and the repeater circuits 22 that transfer the same signal to the A/D conversion circuits 30 belonging to each group are connected in series. Accordingly, in the solid-state imaging device 2 of the second embodiment, a length of a signal wiring for transferring the phase information indicated by the multiphase clock CK and the value of the count value CNT to respective A/D conversion circuits 30 in each column A/D conversion unit 20 may be shorter than in the solid-state imaging device 1 of the first embodiment. In the solid-state imaging device 2 of the second embodiment, the number of stages of the repeater circuit 21 and the repeater circuit 22 included in each column A/D conversion unit 20 can be smaller than in the solid-state imaging device 1 of the first embodiment, and the phase information indicated by the multiphase clock CK and the value of the count value CNT can be transmitted more accurately. Thus, in the solid-state imaging device 2 of the second embodiment, even when the number of pixels is increased, it is possible to improve resolution of the A/D conversion and output the respective digital values of the pixels of which the resolution is high, similar to the solid-state imaging device 1 of the first embodiment. Further, even in the solid-state imaging device 2 of the second embodiment, power not affected by fluctuation in the power when the latch circuit 321 and the latch circuit 322 included in the respective A/D conversion circuits 30 operate can be supplied to each of the repeater circuit 21 and the repeater circuit 22, similar to the solid-state imaging device 1 of the first embodiment.

In the solid-state imaging device 2 of the second embodiment, the configuration in which each of the column A/D conversion units 20 that have been divided is arranged on one side in the column direction of the region in which the pixel array unit 10 is formed, that is, the configuration in which the columns of the pixels included in the array unit 10 are divided into two right and left groups, and the column A/D conversion units 20 corresponding to the respective groups are arranged below the region in which the pixel array unit 10 is formed has been described. However, a method of dividing the columns of pixels included in the pixel array unit 10 is not limited to the method of dividing the columns into the right and the left as shown in FIG. 4.

For example, the columns of the pixels included in the pixel array unit 10 may be divided into two groups of odd columns and even columns, and two column A/D conversion units 20 corresponding to the respective groups may be dividedly arranged in two opposite sides in the column direction of the region in which the pixel array unit 10 is formed. More specifically, the column A/D conversion units 20 corresponding to the odd-numbered columns may be arranged over the region in which the pixel array unit 10 shown in FIG. 4 is formed, and the column A/D conversion units 20 corresponding to the even-numbered columns may be arranged under the region in which the pixel array unit 10 is formed. In this case, for example, the idea of the present invention can be applied to a case in which the pixel array unit 10 is formed in a region in which a width in a horizontal direction of the A/D conversion circuit 30 included in each column A/D conversion unit 20 is greater than a pixel pitch of the pixel included in the pixel array unit 10.

More specifically, the idea of the present invention can be applied as long as a width in a horizontal direction of the A/D conversion circuit 30 included in each column A/D conversion unit 20 is in a range in which a region remaining after the corresponding repeater circuit 21 and the corresponding repeater circuit 22 are formed in each group of A/D conversion circuits 30 can be divided into the respective A/D conversion circuits 30 belonging to the same group. The idea of the present invention can be similarly applied as long as a width in a horizontal direction of the region for forming the respective A/D conversion circuits 30 is simply a width narrower than a pixel pitch corresponding to two adjacent pixels (two columns) of the pixels included in the pixel array unit 10.

In the case of such a configuration, in the solid-state imaging device, the ramp signal generation unit 40 and the clock generation unit 50 common to the respective column A/D conversion units 20 may be arranged in one side in the row direction (for example, a left side) of the region in which the pixel array unit 10 is formed. Further, the ramp signal generation units 40 and the clock generation units 50 having the same configuration corresponding to the respective column A/D conversion units 20 may be arranged in one side in the row direction (for example, a left side, that is, the same position as in the solid-state imaging device 1 of the first embodiment) of the region in which the column A/D conversion units 20 are formed.

For example, the columns of the pixels included in the pixel array unit 10 may be divided into two groups of odd columns and even columns, and then, the columns of the pixels may be divided into the two left and right groups as shown in FIG. 4.

The solid-state imaging device configured with such a configuration may include the ramp signal generation unit 40 and the clock generation unit 50 common to the respective column A/D conversion units 20 or a plurality of ramp signal generation units 40 and a plurality of clock generation units 50 having the same configuration corresponding to the respective column A/D conversion units 20 that have been divided may be included.

For example, when the configuration of the solid-state imaging device is a configuration in which the columns of the pixels included in the pixel array unit 10 may be divided into two groups of odd columns and even columns, and two column A/D conversion units 20 corresponding to the respective groups may be dividedly arranged in two sides in the column direction of the region in which the pixel array unit 10 is formed, it is possible to shorten a length in the vertical direction of the region for forming the respective A/D conversion circuits 30. More specifically, since a width in the horizontal direction of the region for forming the A/D conversion circuit 30 included in each column A/D conversion unit 20 can be widened up to a width close to a pixel pitch corresponding to two adjacent pixels (two columns) among the pixels included in the pixel array unit 10, it is possible to shorten a length in the vertical direction of the region for forming the A/D conversion circuit 30 by shortening and forming the respective components in the A/D conversion circuit 30 in an allowed width in the horizontal direction. In this case, a length of the signal wiring for transferring the latch timing signal to each of the latch circuits 321 and the latch circuit 322 in the A/D conversion circuit 30 can be further shortened, and a reduction of load when the latch control circuit 312 outputs a latch timing signal, and more accurate transfer of the phase information indicated by the multiphase clock CK and the value of the count value CNT in the repeater circuit 21 and the repeater circuit 22 can be realized. Thus, even when the number of pixels of the solid-state imaging device increases, accuracy of the A/D conversion can be improved and the digital value of the pixel of which the resolution is high can be output.

For example, when the configuration of the solid-state imaging device is a configuration in which the columns of the pixels included in the pixel array unit 10 may be divided into two groups of odd columns and even columns, and two column A/D conversion units 20 corresponding to the respective groups may be dividedly arranged in two sides in the column direction of the region in which the pixel array unit 10 is formed, a width in a horizontal direction of the region for forming the respective A/D conversion circuits 30 can be widened. In this case, a region for forming the repeater circuit 21 and the repeater circuit 22 is not widened and driving capability of the repeater unit, that is, the driving capability of signals in the buffer circuit can be increased. Thus, in the solid-state imaging device, the number of stages of the repeater circuit 21 and the repeater circuit 22 included in each column A/D conversion unit 20 can be further reduced.

Third Embodiment

Figure 5:
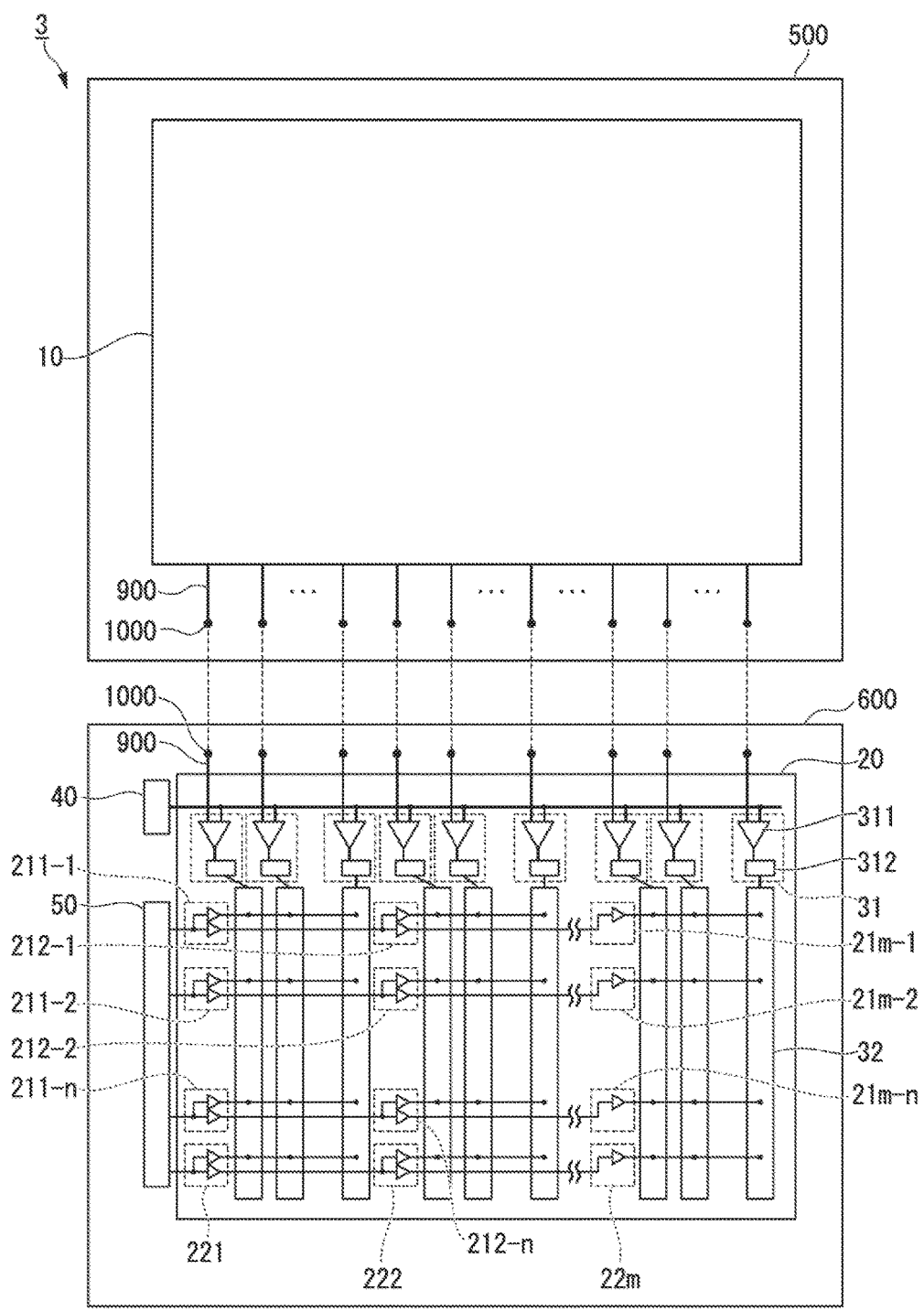
FIG. 5 is a block diagram showing an example of a schematic configuration of a solid-state imaging device according to a third embodiment of the present invention.

Next, a solid-state imaging device of a third embodiment of the present invention will be described. FIG. 5 is a block diagram showing an example of a schematic configuration of the solid-state imaging device of the third embodiment of the present invention. The solid-state imaging device 3 shown in FIG. 5 includes a pixel array unit 10, a column A/D conversion unit 20, a ramp signal generation unit 40, and a clock generation unit 50. In FIG. 5, illustration of components such as the vertical scanning unit, the horizontal scanning unit, and the control unit included in the solid-state imaging device 3 is omitted.

As components of the solid-state imaging device 3 in the third embodiment, the same components as those of the solid-state imaging device 1 of the first embodiment are also included. Therefore, the same components as those of the solid-state imaging device 1 of the first embodiment among the components of the solid-state imaging device 3 in the third embodiment are denoted with the same reference numerals, and detailed description of the respective components will be omitted.

The solid-state imaging device 3 is a solid-state imaging device having a multi-layer substrate structure in which a plurality of substrates are stacked. FIG. 5 shows a solid-state imaging device 3 having a multi-layer substrate structure in which respective components included in the solid-state imaging device 1 of the first embodiment shown in FIG. 1 are divided into and formed in two substrates, and the respective substrates are bonded. More specifically, the solid-state imaging device 3 has a multilayer substrate structure including two semiconductor substrates including a first substrate 500 and a second substrate 600. In the solid-state imaging device 3, the pixel array unit 10 is formed on the first substrate 500 on which light is incident, and the column A/D conversion unit 20, the ramp signal generation unit 40, and the clock generation unit 50 are formed on the second substrate 600. In FIG. 5, respective configurations of the column A/D conversion unit 20, the ramp signal generation unit 40, and the clock generation unit 50 formed on the second substrate 600 are simply shown.

Although FIG. 5 shows the configuration in which the column A/D conversion unit 20, the ramp signal generation unit 40, and the clock generation unit 50 are formed on the second substrate 600, at least the column A/D conversion unit 20, that is, a plurality of A/D conversion circuits 30, the repeater circuit 21, and the repeater circuit 22 may be formed on the second substrate 600. For example, the ramp signal generation unit 40 and the clock generation unit 50 may be formed on the first substrate 500. Further, the ramp signal generation unit 40 and the clock generation unit 50 may be formed on another semiconductor substrate. More specifically, the solid-state imaging device 3 may have a multilayer substrate structure including three semiconductor substrates, the pixel array unit 10 may be formed on the first substrate 500, the column A/D conversion unit 20 may be formed on the second substrate 600, and the ramp signal generation unit 40 and the clock generation unit 50 may be formed on the third substrate.

In the case of a multi-layer substrate structure, signal wirings between the respective semiconductor substrates are electrically connected by a connection portion for electrically connecting signal wirings between different substrates (hereinafter referred to as "inter-substrate connection portion"). As the inter-substrate connection portion, for example, bumps or the like fabricated by a deposition method or a plating method are used. In this case, a space between the respective semiconductor substrates may be filled with an insulating member, such as an adhesive. The components formed in the respective connected semiconductor substrates perform transmission and reception of signals via the inter-substrate connection portion. A structure of the inter-substrate connection portion is not limited to a bump scheme and, for example, a through-silicon-via (TSV) scheme may be used.

In the solid-state imaging device 3, the respective column signal wirings 900 are connected by corresponding inter-substrate connection portions 1000. Thus, in the solid-state imaging device 3, the pixel signals of the respective columns output from the respective pixels included in the pixel array unit 10 formed on the first substrate 500 are transferred by the respective column signal wirings 900 connected by the inter-substrate connection portions 1000 and input to a positive input terminal of the comparator 311 included in the A/D conversion circuit 30 of the corresponding column included in the column A/D conversion unit 20 formed on the second substrate 600.

The solid-state imaging device 3 performs A/D conversion on pixel signals of the respective columns output from the respective pixels included in the pixel array unit 10 using the respective A/D conversion circuits 30 that are A/D conversion circuits of an SS+TDC type A/D conversion scheme included in the column A/D conversion unit 20, and sequentially outputs digital values of the pixels, similar to the solid-state imaging device 1 of the first embodiment.

As described above, the solid-state imaging device 3 of the third embodiment has a configuration in which the respective components included in the solid-state imaging device 1 of the first embodiment shown in FIG. 1 are divided and formed in the two substrates, that is, the first substrate 500 and the second substrate 600. Therefore, the arrangement of the A/D conversion circuit 30, the repeater circuit 21, and the repeater circuit 22 in the column A/D conversion unit 20 formed in the second substrate 600 is the same as that of the solid-state imaging device 1 of the first embodiment. Accordingly, detailed description of the arrangement of the A/D conversion circuit 30, the repeater circuit 21, and the repeater circuit 22 in the column A/D conversion unit 20 in the solid-state imaging device 3 will be omitted.

A method of forming a power wiring and a GND wiring for supplying power to each of the A/D conversion circuit 30, the repeater circuit 21, and the repeater circuit 22 included in each column A/D conversion unit 20 formed on the second substrate 600 is also the same as in the solid-state imaging device 1 of the first embodiment. Therefore, detailed description of a method of forming the power wiring and the GND wiring in each column A/D conversion unit 20 in the solid-state imaging device 3 will be omitted.

In the solid-state imaging device 3, the respective components are divided and formed in a plurality of semiconductor substrates, as described above. Thus, since the number of the components formed on the first substrate 500 and the components formed on the second substrate 600 can be reduced, it is possible to reduce a size of the respective semiconductor substrate and reduce a chip area (mounting area) of the solid-state imaging device 3. Further, in the solid-state imaging device 3, the respective semiconductor substrates can be fabricated by a semiconductor fabrication process suitable for the components to be formed. For example, the fabrication process of fabricating the first substrate 500 and the fabrication process of fabricating the second substrate 600 may be different fabrication processes. For example, a finer fabrication process than the fabrication process of fabricating the first substrate 500 can be used as the fabrication process of fabricating the second substrate 600. Thus, it is possible to reduce a circuit area of each of the components formed on the second substrate 600, and to more easily arrange the A/D conversion circuit 30, the repeater circuit 21, and the repeater circuit 22 in the column A/D conversion unit 20. That is, it is possible to more easily realize the idea of the present invention. Further, it is also possible to realize low power consumption by fabricating the second substrate 600 through the fine fabrication process.

According to the third embodiment, the solid-state imaging device (the solid-state imaging device 3) in which the first substrate (the first substrate 500) on which at least the pixel array unit (pixel array unit 10) is formed, and the second substrate (the second substrate 600) on which at least the signal-processing unit (the column A/D conversion unit 20) is formed are electrically connected by the connection portion (the inter-substrate connection portion 1000) that connects the first substrate 500 to the second substrate 600.

In the solid-state imaging device 3 of the third embodiment, the respective components are divided and formed in the plurality of semiconductor substrates. In the column A/D conversion unit 20, the regions of the A/D conversion circuits 30 are shortened and formed in each group of the predetermined number of A/D conversion circuits 30, and the repeater circuit 21 and the repeater circuit 22 corresponding to each group are formed in an empty region, as in the solid-state imaging device 1 of the first embodiment. Accordingly, in the solid-state imaging device 3 of the third embodiment, it is possible to obtain the same effects as in the solid-state imaging device 1 of the first embodiment. That is, even when the number of pixels included in the pixel array unit 10 in the solid-state imaging device 3 increases, the phase information indicated by the multiphase clock CK and the value of the count value CNT are accurately transmitted to the latch circuit 321 and the latch circuit 322 in the A/D conversion circuit 30 of all columns included in the column A/D conversion unit 20, and respective digital values of the pixels in which the resolution of the A/D conversion has been improved can be output.

In the solid-state imaging device 3 of the third embodiment, by dividing and forming the respective components into the plurality of semiconductor substrates, the respective semiconductor substrates can be fabricated in a fabrication process suitable for components to be formed. Thus, in the solid-state imaging device 3 of the third embodiment, it is possible to realize miniaturization and low power consumption of the solid-state imaging device 3.

In the solid-state imaging device 3 of the third embodiment, the case in which the respective components included in the solid-state imaging device 1 of the first embodiment shown in FIG. 1 are divided and formed in the two substrates, that is, the column A/D conversion unit 20 included in the solid-state imaging device 1 is formed in the second substrate 600 has been described. However, the configuration of the solid-state imaging device 3 can also be the same configuration as the solid-state imaging device 2 of the second embodiment shown in FIG. 4. That is, a plurality of column A/D conversion units 20 in which the pixels included in the pixel array unit 10 are divided in units of columns may be formed on the second substrate 600, as in the column A/D conversion unit 20 included in the solid-state imaging device 2.

As described above, according to each embodiment of the present invention, in the column A/D conversion type solid-state imaging device including an A/D conversion circuit in each column of pixels included in the pixel array unit, the predetermined number of A/D conversion circuits are divided into sets (groups) and the regions of the A/D conversion circuits are shortened and formed for each group. In each embodiment of the present invention, a repeater circuit that transfers a signal that is used when the respective A/D conversion circuits belonging to each group perform A/D conversion is formed in an empty region by shortening and forming the regions of the A/D conversion circuits. The repeater circuits in the respective groups are connected in series. Accordingly, in each embodiment of the present invention, even when the number of pixels of the solid-state imaging device increases, a signal that is used when the A/D conversion is performed can be accurately transferred to the A/D conversion circuits of all the columns by the repeater circuits, and respective digital values of the pixels in which the resolution of the A/D conversion has been improved can be output.

According to each embodiment of the present invention, wirings of power and GND of each latch circuit included in the A/D conversion circuit and wirings of power and GND of each repeater circuit are arranged so that the respective wirings of the power and GND do not interfere. Accordingly, in each embodiment of the present invention, an instantaneous fluctuation in the power and GND when the latch circuit operates can be prevented from affecting the power and GND for the respective repeater circuits. Thus, in each embodiment of the present invention, even when the number of pixels of the solid-state imaging device is increased, respective digital values of the pixels of which the resolution has been improved can be output without degradation of accuracy of the A/D conversion.

According to each embodiment of the present invention, the configuration in which the latch control circuit 312 for operating the latch circuit 321 and the latch circuit 322 in the A/D conversion circuit 30 during a predetermined short latch execution period is included in the comparison unit 31 as the A/D conversion circuit 30 included in the column A/D conversion unit 20 has been described. However, the A/D conversion circuit included in the column A/D conversion unit in the solid-state imaging device of the present invention is not limited to the configuration shown in each embodiment of the present invention as long as the A/D conversion circuit is an A/D conversion circuit configured to hold (latch) phase information caused to be held in the reference clock. For example, the idea of the present invention can be similarly applied to a configuration in which an A/D conversion circuit having no latch control circuit 312 included in the A/D conversion circuit 30 shown in each embodiment is included in the column A/D conversion unit. This is because each of the plurality of latch circuits included in the A/D conversion circuit including no latch control circuit operates to take the phase information from a timing at which A/D conversion starts and to hold the phase information taken at a timing at which the comparison result signal output from the comparator is inverted, and fluctuation of the power for the latch circuit at this timing is the same as in the A/D conversion circuit 30 shown in each embodiment. Accordingly, it is possible to obtain the same effects as the effects of the present invention by applying the idea of the present invention to the column A/D conversion unit having a configuration in which a plurality of A/D conversion circuits including no latch control circuit are included.

According to each embodiment of the present invention, the configuration in which the counting unit 502 is included in the clock generation unit 50, and the count value CNT output by the counting unit 502 is transferred to the respective A/D conversion circuits 30 by the repeater circuit 22 has been described. However, the configuration of the A/D conversion circuit is not limited to the configuration shown in each embodiment. For example, the A/D conversion circuit may be an A/D conversion circuit having a configuration in which the counting unit is included in each A/D conversion circuit, and a count value obtained by the counting unit counting a reference clock is output as upper bits of a digital value after the A/D conversion. In this case, a repeater circuit corresponding to the repeater circuit 22 shown in each embodiment is configured to transfer a reference clock generated by the clock generation unit to each A/D conversion circuit.

According to each embodiment of the present invention, the configuration of the column A/D conversion unit 20 including the A/D conversion circuits 30 by the number of columns of pixels arranged in the pixel array unit 10, that is, including the A/D conversion circuit 30 corresponding to each column of the pixel array unit 10 has been described. However, the number of A/D conversion circuits included in the column A/D conversion unit is not limited to the number shown in each embodiment. For example, the column A/D conversion unit may have a configuration in which the corresponding A/D conversion circuit is included for every plurality of predetermined columns of the pixels arranged in the pixel array unit. Even in this case, the idea of the present invention can be similarly applied by dividing the A/D conversion circuits into sets (groups) for each predetermined number.

The solid-state imaging device shown in each embodiment of the present invention can also include a plurality of signal-processing circuits that perform analog processing such as a correlated double sampling (CDS) process, to correspond to the respective columns of pixels arranged in the pixel array unit between the pixel array unit and the column A/D conversion unit. In this case, for example, in the solid-state imaging device 1 of the first embodiment of the present invention, each of the signal-processing circuit performs analog processing on the pixel signal (analog signal) input from the pixel array unit 10, and then, outputs the analog signal after processing to the column A/D conversion unit 20. Each of the A/D conversion circuits 30 in the column A/D conversion unit 20 performs A/D conversion on the analog signal processed by the corresponding signal-processing circuit.

According to the embodiments of the present invention, the configuration of the solid-state imaging device 3 in which two semiconductor substrates including the first substrate 500 and the second substrate 600 are stacked has been described. However, the number of substrates stacked in the solid-state imaging device is not limited to 2, and the configuration may be a configuration in which more substrates are stacked.

The embodiments of the present invention have been described with reference to the drawings, but a specific configuration is not limited to this embodiment, and various modifications without departing from the spirit of the present invention are also included. The invention is not limited to the above-mentioned embodiments and is limited only by the accompanying claims.

What is claimed is:

1. A solid-state imaging device, comprising:
a pixel array unit in which a plurality of pixels outputting an analog pixel signal according to the quantity of incident light are arranged in a two-dimensional matrix form, the pixel array unit outputting the pixel signal for each row, and the pixel signal being output by the pixels arranged in each column;
a ramp signal generation unit configured to generate and output a ramp wave which is an analog reference voltage monotonically decreasing or monotonically increasing at a constant rate with respect to time;
a clock generation unit configured to generate and output multiphase clocks obtained by changing a phase of a clock serving as a reference into a different phase; and
a signal-processing unit, wherein the signal-processing unit including:
a plurality of analog-to-digital conversion circuits, the plurality of analog-to-digital conversion circuits being arranged in each column or in every multiple columns of the pixels arranged in the pixel array unit, the plurality of analog-to-digital conversion circuits performing analog-to-digital conversion on the pixel signal output by the pixel of the corresponding column according to the multiphase clocks, and the plurality of analog-to-digital conversion circuits outputting a digital value according to a magnitude of the pixel signal, and
a plurality of repeater circuits, the plurality of repeater circuits respectively corresponding to a plurality of sets into which the plurality of analog-to-digital conversion circuits are divided for a predetermined number in advance, and the plurality of repeater circuits respectively relaying and transferring the multiphase clocks to the plurality of analog-to-digital conversion circuits included in the corresponding set,
wherein each of the plurality of analog-to-digital conversion circuits includes:
a comparison unit configured to compare a voltage of the pixel signal with the ramp wave and output a timing signal according to a comparison result of the voltage of the pixel signal and the ramp wave, and
a latch unit in which a plurality of latch circuits are arranged side by side in a column direction, each of the plurality of latch circuits holding a state of each phase of the multiphase clocks transferred by the corresponding repeater circuits according to the timing signal,
wherein each of the plurality of the analog-to-digital conversion circuits outputs the digital value according to the state of the phase held by each latch circuit arranged in the latch unit, and
wherein each of the plurality of the repeater circuits corresponding to the same set are arranged side by side in the column direction and arranged between the analog-to-digital conversion circuits included in the different sets, and the repeater circuits corresponding to the different sets that transfer the multiphase clocks indicating the same phase, are connected in series.

2. The solid-state imaging device according to claim 1, wherein power is supplied to each of the plurality of the repeater circuits by a corresponding sub-wiring formed to extend in the column direction from a main-wiring formed in the row direction at respective positions at which the plurality of the repeater circuits corresponding to the same set are arranged side by side in the column direction, and
wherein a width of a region for forming the main-wiring in the column direction is greater than a width of a region for forming each sub-wiring in the row direction.

3. The solid-state imaging device according to claim 1, wherein power is supplied to each of the plurality of the repeater circuits by a corresponding sub-wiring formed to extend in the column direction from a main-wiring formed in the row direction at respective positions at which a plurality of the repeater circuits corresponding to the same set are arranged side by side in the column direction, and
wherein a region for forming each sub-wiring does not overlap a region of a power wiring for supplying power to each latch circuit.

4. The solid-state imaging device according to claim 1,
wherein power is supplied to each of the plurality of the latch circuits by a corresponding sub-wiring formed to extend in the column direction from a main-wiring formed in the row direction at respective positions at which the plurality of the latch circuits included in the same analog-to-digital conversion circuit are arranged side by side in the column direction, and
wherein a width in the column direction of a region for forming the main-wiring is greater than a width in the row direction of a region for forming each respective sub-wiring.

5. The solid-state imaging device according to claim 4, wherein the respective sub-wirings are formed by collecting the sub-wirings corresponding to the respective latch circuits included in a predetermined number of analog-to-digital conversion circuits belonging to the same set.

6. The solid-state imaging device according to claim 1,
wherein power is supplied to each of the plurality of the latch circuits by a corresponding sub-wiring formed to extend in the column direction from a main-wiring formed in the row direction at respective positions at which the plurality of the latch circuits included in the same analog-to-digital conversion circuit are arranged side by side in the column direction, and
a region for forming each sub-wiring does not overlap a region of a power wiring for supplying power to each repeater circuit.

7. The solid-state imaging device according to claim 6, wherein the respective sub-wirings are formed by collecting the sub-wirings corresponding to the respective latch circuits included in a predetermined number of analog-to-digital conversion circuits belonging to the same set.

8. The solid-state imaging device according to claim 1,
wherein the signal-processing units are dividedly arranged to correspond to a plurality of respective groups into which the plurality of the pixels arranged in the pixel array unit are divided for each predetermined column of pixels, and
wherein the clock generation unit is arranged at a position between the dividedly arranged signal-processing units.

9. The solid-state imaging device according to claim 8,
wherein the plurality of the arranged pixels in the pixel array unit are divided into the two groups for each column of the pixels,
wherein the signal-processing units are dividedly arranged in a first signal-processing unit corresponding to one of the groups and a second signal-processing unit corresponding to the other group, and
wherein the clock generation unit is arranged at a position between the first signal-processing unit and the second signal-processing unit.

10. The solid-state imaging device according to claim 8,
wherein the plurality of the arranged pixels in the pixel array unit are divided into two groups having a left group and a right group at a position of a center column for each column of the pixels,
wherein the signal-processing units are dividedly arranged in a first signal-processing unit corresponding to the left group and a second signal-processing unit corresponding to the right group, and
wherein the clock generation unit is arranged at a center position between the first signal-processing unit and the second signal-processing unit.

11. The solid-state imaging device according to claim 1,
wherein the signal-processing unit is arranged on any one side in the column direction of the pixel array unit, and
wherein a width in the row direction of a region for forming each analog-to-digital conversion circuit is smaller than an interval between the two pixels arranged adjacent in the row direction in the pixel array unit.

12. The solid-state imaging device according to claim 1,
wherein the signal-processing units are dividedly arranged on two opposite sides in a column direction of the pixel array unit to correspond to a plurality of respective groups into which the plurality of pixels arranged in the pixel array unit are divided for each predetermined column of pixels, and
wherein a width in a row direction of a region for forming the respective analog-to-digital conversion circuits respectively included in the signal-processing units that are dividedly arranged is greater than an interval between two pixels arranged adjacent in the row direction in the pixel array unit and is smaller than a width in the row direction at which the two pixels arranged adjacent in the row direction are formed.

13. The solid-state imaging device according to claim 1,
wherein a first substrate on which at least the pixel array unit is formed and a second substrate on which at least the signal-processing unit is formed are electrically connected by a connection portion that connects the first substrate to the second substrate.

* * * * *